United States Patent [19]
Fujita et al.

[11] Patent Number: 5,844,306
[45] Date of Patent: *Dec. 1, 1998

[54] DIE PAD STRUCTURE FOR SOLDER BONDING

[75] Inventors: Kazumoto Fujita, Hyogo; Takashi Iwata, Kagawa; Tetsuya Kurokawa, Hyogo, all of Japan

[73] Assignees: Mitsubishi Denki Kabushiki Kaisha, Tokyo; Shikoku Instrumentation Co., Ltd., Kagawa, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 590,797

[22] Filed: Jan. 24, 1996

[30] Foreign Application Priority Data

Sep. 28, 1995 [JP] Japan .................................... 7-250934

[51] Int. Cl.$^6$ ................................................. H01L 23/495
[52] U.S. Cl. ........................... 257/676; 257/666; 257/667; 257/669
[58] Field of Search .................................... 257/666, 667, 257/669, 774, 676

[56] References Cited

U.S. PATENT DOCUMENTS 5,397,915  3/1995  Noes ........................... 257/666
5,440,169  8/1995  Tomita et al. ................. 257/667

FOREIGN PATENT DOCUMENTS

| | | |
|---|---|---|
| 60-178636 | 9/1985 | Japan . |
| 61-63043 | 4/1986 | Japan . |
| 61-188951 | 8/1986 | Japan . |
| 62-252159 | 11/1987 | Japan . |
| 63-310151 | 12/1988 | Japan . |
| 1-225260 | 10/1989 | Japan . |
| 2-246143 | 10/1990 | Japan . |
| 4-290254 | 10/1992 | Japan . |

*Primary Examiner*—Carl W. Whitehead
*Attorney, Agent, or Firm*—McDermott, Will & Emery

[57] ABSTRACT

A lead frame having a die pad of such a shape that prevents scattering of solder to lead when a chip is mounted on the lead frame, and a semiconductor device using such a lead frame are provided. The lead frame includes a die pad having a region surrounded by a first side, a second side opposing to the first side, a third side different from the first and second sides, and a fourth side opposing to the third side, and a lead formed of a conductor and electrically connected to a semiconductor element. The die pad includes a notch extending along the first and the second sides and positioned opposing to a main surface of the semiconductor element, and a through hole extending along the third and fourth sides and positioned opposing to the main surface of the semiconductor element. The semiconductor device employs the die pad.

34 Claims, 35 Drawing Sheets

FIG. 31   PRIOR ART
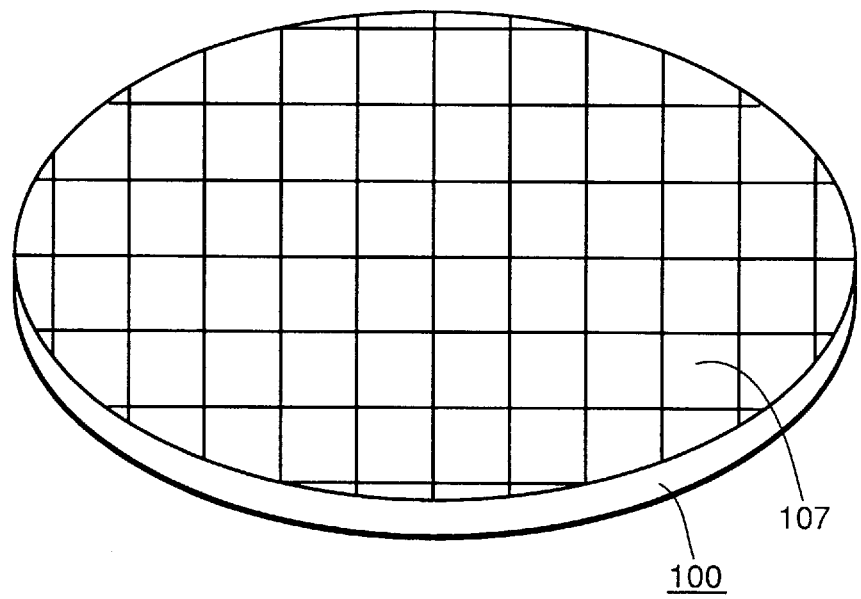
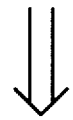
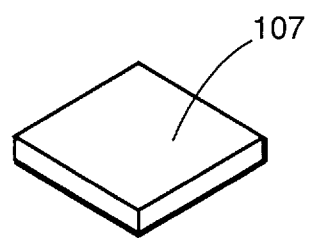

5,844,306

DIE PAD STRUCTURE FOR SOLDER BONDING

BACKGROUND OF THE INVENTION

1. Field of the Invention

The present invention relates to a semiconductor device and a lead frame. More specifically, it relates to a semiconductor device and a lead frame preventing problem in the step of die bonding.

2. Description of the Background Art

A conventional method of manufacturing a semiconductor device will be described with reference to the figures.

FIG. 30 is a flow chart showing the conventional method of manufacturing a semiconductor device. Referring to FIG. 30, a semiconductor device is manufactured through the steps of wafer process 201, dicing 202, die bonding 203, wire bonding 204, molding 205, plating 206, lead cutting and forming 207 and marking 208, followed by a final step of testing 209, thus completed and shipped.

Each of the steps shown in FIG. 30 will be described with reference to the figures. First, the step of dicing 202 will be described. FIG. 31 is a perspective view showing the step of dicing 202. Referring to FIG. 31, there are a plurality of chips 107 formed on a wafer 100. A chip 107 is formed in the step of wafer process 201. In this step, the wafer 100 is cut in accordance with the shape of the chip 107, so as to take each of the chips 107.

The step of die bonding 203 will be described. FIG. 32 is a perspective view showing the step of die bonding 203. Referring to FIG. 32, a lead frame includes a frame 105, leads 106, a die pad 101 and a connecting portion 104. Frame 105 is connected to die pad 101 by connecting portion 104. Leads 106 are arranged opposing to die pad 101. Though only six leads 106 are shown in FIG. 32, the number of leads 106 is not limited. In this step, first, a solder 111 is placed at a central portion of die pad 101. Then, a chip 107 having smaller two-dimensional area than die pad 101 is placed on solder 111, and chip 107 is pressed, so that solder 111 is spread entirely over the interface between die pad 101 and chip 107. In this manner, chip 107 is mounted on die pad 101 with solder 111 interposed therebetween.

The step of wire bonding 204 will be described. FIG. 33 is a perspective view showing the step of wire bonding 204. Referring to FIG. 33, by ultrasonic bonding method or the like, chip 107 is electrically connected to lead 106 by a gold wire 110.

The step of molding 205 will be described. FIG. 34 is a perspective view showing the step of molding 205. Referring to FIG. 34, a part of the connecting portion 104, a part of leads 106, die pad 101, solder 111, chip 107 and gold wire 110 are covered with a resin 108. Epoxy resin or a silicone resin is used as resin 108.

The step of plating 206 will be described. FIG. 35 is a perspective view showing the step of plating 206. Referring to FIG. 35, by plating leads 106, lead terminals 109 are provided. Lead terminals 109 formed in this manner by plating leads 106 have superior oxidation resistance and corrosion resistance as compared with leads 106.

The step of lead cutting and forming 207 will be described. FIG. 36 is a perspective view showing the step of lead cutting and forming 207. Referring to FIG. 36, the lead terminals 109 are bent in prescribed directions.

The step of marking 208 will be described. FIG. 37 is a perspective view showing the step of marking 208. Referring to FIG. 37, a marking 112 is provided on resin 108. Thus, a semiconductor device 113 is completed.

Now, a problem experienced in the step of die bonding 203 shown in FIG. 32 will be described.

FIG. 38 is a plan view showing a lead frame used in the step of die bonding 203. Referring to FIG. 38, the lead frame includes a frame 105, a die pad 101, leads 106 and a connection portion 104. In this figure, there are three die pads 101. However, the number of die pads 101 in the lead frame is not limited. A plurality of die pads 101 are positioned aligned between two frames 105.

FIG. 39 is a plan view showing a portion of a lead frame. Referring to FIG. 39, leads 106 are arranged opposing to the die pad 101. Frame 105 and die pad 101 are connected by connecting portion 104.

FIG. 40 is a plan view showing a chip 107 mounted on die pad 101 in the step of die bonding 203 shown in FIG. 32. Referring to FIG. 40, a chip 107 is mounted on die pad 101 of a lead frame which is structured similarly to the lead frame shown in FIG. 39.

FIG. 41 is a cross section taken along the line XXXXI—XXXXI of FIG. 40, and FIG. 42 is a cross section taken along the line XXXXII—XXXXII. Referring to FIGS. 41 and 42, when the chip 107 is mounted on die pad 101 with solder 111 interposed, first, solder 111 is placed only at the central portion of die pad 101, and chip 107 is placed on solder 111. Thereafter, pressure is applied to chip 107 in the direction of the arrow 115, so as to spread solder 111. At this time, parts 111a and 111b of solder 111 scatter to the leads 106 and frame 105.

When parts 111a and 111b of solder scatter to lead 106 of frame 105, there arises a problem that lead 106 and chip 107 cannot be connected by gold wire 110 in the step of wire bonding 204 (FIG. 33) following the step of die bonding.

SUMMARY OF THE INVENTION

An object of the present invention is to provide a lead frame which can prevent scattering of solder in the step of die bonding 203.

Another object of the present invention is to provide semiconductor devices with high production yield, while preventing scattering of solder.

The semiconductor device in accordance with one aspect of the present invention includes a semiconductor element, a die pad, lead terminals and resin. The semiconductor element has a main surface. The die pad has a main surface on which the semiconductor element is mounted with an adhesive layer interposed, and has a region surrounded by a first side, a second side opposing to the first side, a third side different from the first and second sides, and a fourth side opposing to the third side. Further, the die pad includes a notch extending along the first and second sides and positioned opposing to the main surface of the semiconductor element, and a through hole extending along the third and fourth sides and positioned opposing to the main surface of the semiconductor element. The lead terminals are a conductor electrically connected to the semiconductor element. The resin covers part of the lead terminals, the semiconductor element and the die pad.

The first side is parallel to the second side, the third side is parallel to the fourth side and the first and third sides may cross orthogonally with each other.

One end of each of a plurality of lead terminals may oppose to the first and second sides. The notch may be provided opposing to one end of the lead terminals.

In the semiconductor device structured as described above, the adhesive material flows to the notch and the through hole when the semiconductor element is mounted on the die pad. Therefore, the adhesive material does not scatter to the leads. Therefore, the problem that the leads cannot be electrically connected to the semiconductor element can be prevented, and production yield of the semiconductor devices can be increased.

The semiconductor device in accordance with another aspect of the present invention includes a semiconductor element, a die pad, lead terminals and a resin. The semiconductor element has a main surface. The die pad has a main surface on which the semiconductor element is mounted with an adhesive layer interposed, and has a region surrounded by a first side, a second side opposing to the first side, a third side different from the first and second sides and a fourth side opposing to the third side. The die pad has a first through hole extending along the first and second sides and positioned opposing to the main surface of the semiconductor element, and a second through hole extending along the third and fourth sides and positioned opposing to the main surface of the semiconductor element. The lead terminal is a conductor electrically connected to the semiconductor element. The resin covers part of the lead terminals, the semiconductor element and the die pad.

The first side is parallel to the second side, and the second side is parallel to the fourth side and the first and third sides may cross orthogonally with each other.

One end of the plurality of lead terminals may oppose to the first and second sides.

The first and second through holes may be positioned in plural in the periphery of the die pad.

The first through hole may be positioned opposing to one end of the lead terminals.

In the semiconductor device structured in this manner, the adhesive material flows to the first and second through holes, when the semiconductor element is mounted on the die pad. Therefore, the adhesive material does not scatter to the lead terminals. Therefore, the problem that the lead terminals and the semiconductor element cannot be electrically connected can be prevented, and hence production yield of the semiconductor device can be improved.

Further, the semiconductor device in accordance with a still further aspect of the present invention includes a semiconductor element, a die pad, lead terminals and a resin. The semiconductor element has a main surface. The die pad has a main surface on which the semiconductor element is mounted with an adhesive layer interposed, and has a region surrounded by a first side, a second side opposing to the first side, a third side different from the first and second sides, and a fourth side opposing to the third side. The die pad has a plurality of recesses aligned in staggered manner along the first and second sides and a through hole extending along the third and fourth sides and positioned opposing to the main surface of the semiconductor element. The lead terminal is a conductor electrically connected to the semiconductor element. The resin covers parts of the lead terminals, the semiconductor element and die pad.

The first side is parallel to the second side, the third side is parallel to the fourth side, and the first and third sides may cross orthogonal with each other. One end of the plurality of lead terminals may oppose to the first and second sides.

The through hole and the recesses may be positioned in the periphery of the die pad.

The recesses may be positioned opposing to one end of the lead terminals.

In the semiconductor device structured as described above, adhesive material flows to the recesses and the through hole, when the semiconductor element is mounted on the die pad. Therefore, the adhesive material does not scatter to the leads. Therefore, the problem that the leads cannot be electrically connected to the semiconductor element can be prevented, and hence production yield of the semiconductor device can be improved.

The lead frame in accordance with one aspect of the present invention includes a die pad and leads. The die pad has a main surface on which the semiconductor element is mounted with an adhesive layer interposed, and has a region surrounded by a first side, a second side opposing to the first side, a third side different from the first and second sides, and a fourth side opposing to the third side. Further, the die pad includes a notch extending along the first and second sides and positioned opposing to the main surface of the semiconductor element, and a through hole extending along the third and fourth sides and positioned opposing to the main surface of the semiconductor element. The lead terminals are a conductor electrically connected to the semiconductor element.

The first side is parallel to the second side, the third side is parallel to the fourth side and the first and third sides may cross orthogonally with each other.

A plurality of lead terminals may extend to the first and second sides.

The notch may be provided in the direction of extension of the lead terminals.

In the lead frame structured as described above, the adhesive material flows to the notch and the through hole when the semiconductor element is mounted on the die pad. Therefore, the adhesive material does not scatter to the leads. Therefore, the problem that the leads cannot be electrically connected to the semiconductor element in the step of wire bonding can be prevented.

The lead frame in accordance with another aspect of the present invention includes a die pad and leads. The die pad has a main surface on which the semiconductor element is mounted with an adhesive layer interposed, and has a region surrounded by a first side, a second side opposing to the first side, a third side different from the first and second sides and a fourth side opposing to the third side. The die pad has a first through hole extending along the first and second sides and positioned opposing to the main surface of the semiconductor element, and a second through hole extending along the third and fourth sides and positioned opposing to the main surface of the semiconductor element. The lead terminal is a conductor electrically connected to the semiconductor element.

The first side is parallel to the second side, and the second side is parallel to the fourth side and the first and third sides may cross orthogonally with each other.

A plurality of leads may extend to the first and second sides.

The first and second through holes may be positioned in plural in the periphery of the die pad.

The first through hole may be positioned in the direction of extension of the leads.

In the lead frame structured in this manner, the adhesive material flows to the first and second through holes, when the semiconductor element is mounted on the die pad in the step of die bonding. Therefore, the adhesive material does not scatter to the leads. Therefore, the problem that the leads and the semiconductor element cannot be electrically connected in the step of wire bonding can be prevented, and hence production yield of the semiconductor device can be improved.

Further, the lead frame in accordance with a still further aspect of the present invention includes a die pad and leads. The die pad has a main surface on which the semiconductor element is mounted with an adhesive layer interposed, and has a region surrounded by a first side, a second side opposing to the first side, a third side different from the first and second sides, and a fourth side opposing to the third side. The die pad has a plurality of recesses aligned in staggered manner along the first and second sides and a through hole extending along the third and fourth sides and positioned opposing to the main surface of the semiconductor element. The lead is a conductor electrically connected to the semiconductor element.

The first side is parallel to the second side, the third side is parallel to the fourth side, and the first and third sides may cross orthogonal with each other.

A plurality of leads may extend to the first and second sides.

The through hole and the recesses may be positioned in the periphery of the die pad.

The recesses may be positioned opposing to the direction of extension of the leads.

In the lead frame structured as described above, adhesive material flows to the recesses and the through hole, when the semiconductor element is mounted on the die pad in the step of die bonding. Therefore, the adhesive material does not scatter to the leads. Therefore, the problem that the leads cannot be electrically connected to the semiconductor element in the step of wire bonding can be prevented.

The lead frame in accordance with one aspect of the present invention includes a die pad, leads, a frame and a connecting portion. The die pad has a main surface on which the semiconductor element is mounted with an adhesive layer interposed, and has a region surrounded by a first side, a second side opposing to the first side, a third side different from the first and second sides, and a fourth side opposing to the third side. Further, the die pad includes a notch extending along the first and second sides and positioned opposing to the main surface of the semiconductor element, and a through hole extending along the third and fourth sides and positioned opposing to the main surface of the semiconductor element. The lead is a conductor electrically connected to the semiconductor element. The frame couples the die pad to the leads. The connecting portion connects the frame to the die pad.

The connecting portion may be connected to the third and fourth sides of the die pad, respectively.

A plurality of leads may extend to the first and second sides. The through hole may be provided on both sides of the portion of the die pad connected to the connecting portion.

In the lead frame structured as described above, the adhesive material flows to the notch and the through hole when the semiconductor element is mounted on the die pad in the step of die bonding. Therefore, the adhesive material does not scatter to the leads. Therefore, the problem that the leads cannot be electrically connected to the semiconductor element in the step of wire bonding can be prevented.

The lead frame in accordance with another aspect of the present invention includes a die pad, leads, a frame and a connecting portion. The die pad has a main surface on which the semiconductor element is mounted with an adhesive layer interposed, and has a region surrounded by a first side, a second side opposing to the first side, a third side different from the first and second sides and a fourth side opposing to the third side. The die pad has a first through hole extending along the first and second sides and positioned opposing to the main surface of the semiconductor element, and a second through hole extending along the third and fourth sides and positioned opposing to the main surface of the semiconductor element. The lead terminal is a conductor electrically connected to the semiconductor element. The frame couples the die pad to the leads. The connecting portion connects the frame to the die pad.

The connecting portion may be connected to the third and fourth sides of the die pad, respectively.

A plurality of leads may extend to the first and second sides.

The second through hole may be positioned on both sides of a portion of the die pad connected to the connecting portion.

In the lead frame structured in this manner, the adhesive material flows to the first and second through holes, when the semiconductor element is mounted on the die pad in the step of die bonding. Therefore, the adhesive material does not scatter to the leads. Therefore, the problem that the leads and the semiconductor element cannot be electrically connected in the step of wire bonding can be prevented.

Further, the lead frame in accordance with a still further aspect of the present invention includes a die pad, leads, a frame and a connecting portion. The die pad has a main surface on which the semiconductor element is mounted with an adhesive layer interposed, and has a region surrounded by a first side, a second side opposing to the first side, a third side different from the first and second sides, and a fourth side opposing to the third side. The die pad has a plurality of recesses aligned in staggered manner along the first and second sides and a through hole extending along the third and fourth sides and positioned opposing to the main surface of the semiconductor element. The lead is a conductor electrically connected to the semiconductor element. The frame couples the die pad to the leads. The connecting portion connects the frame to the die pad.

The connecting portion may be connected to the third and fourth sides of the die pad, respectively.

A plurality of leads may extend to the first and second sides.

The through hole may be positioned on both sides of a portion of the die pad connected to the connecting portion.

In the lead frame structured as described above, adhesive material flows to the recesses and the through hole in the step of wire bonding, when the semiconductor element is mounted on the die pad. Therefore, the adhesive material does not scatter to the leads. Therefore, the problem that the leads cannot be electrically connected to the semiconductor element in the step of wire bonding can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 31 is a perspective view showing the step of dicing of the conventional method of manufacturing a semiconductor device.

DESCRIPTION OF THE PREFERRED EMBODIMENTS

Embodiments of the present invention will be described with reference to the figures.

Figure 1:
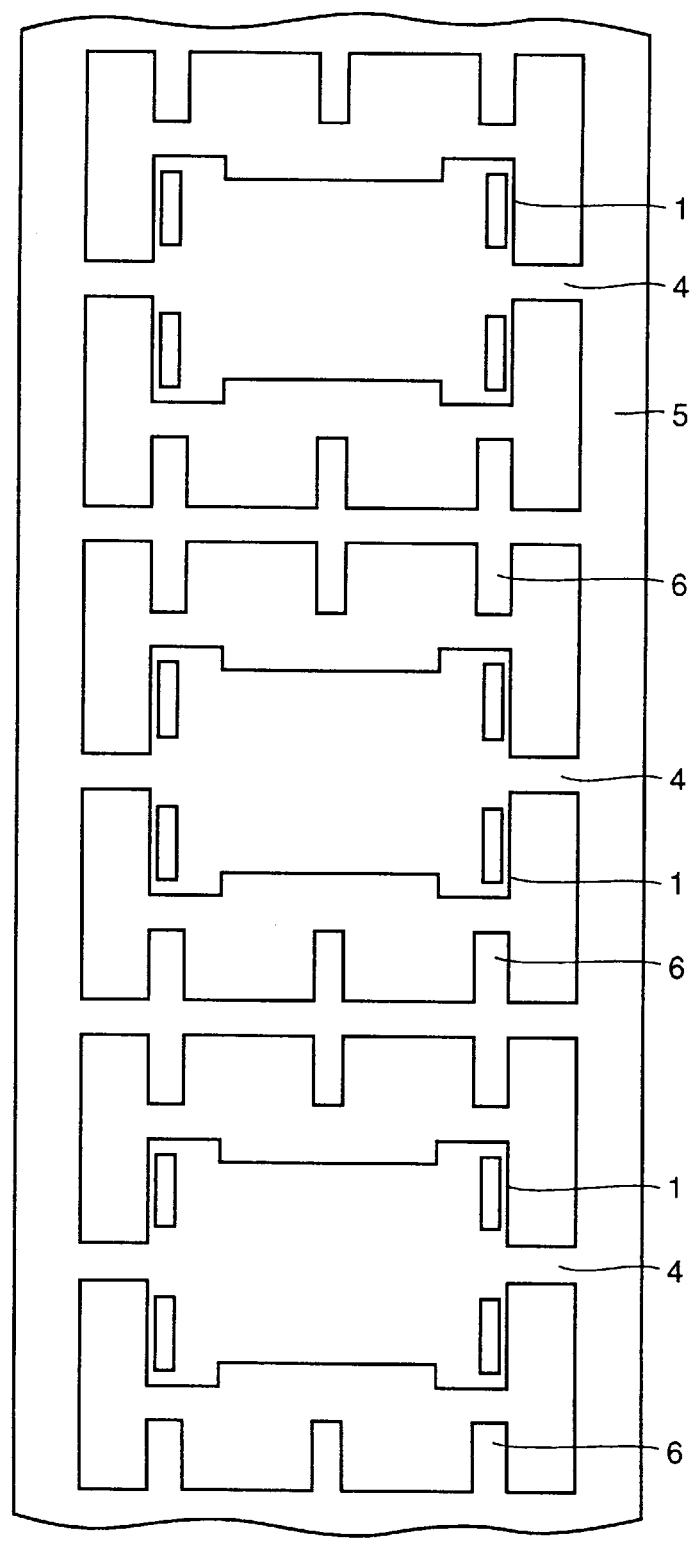
FIG. 1 is a plan view showing a lead frame in accordance with a first embodiment of the present invention.

Referring to FIG. 1, a lead frame includes die pads 1, a frame 5, leads 6 and connecting portions 4. Though three die pads 1 are shown in the figure, the number of die pads 1 in the lead frame is not limited. A plurality of die pads 1 are arranged along one direction between two frames 5. Leads 6 are arranged opposing to the die pads. Though only six leads 6 are shown in the figure, the number of leads 6 is not limited. The die pad 1 is connected to the frame 5 by connecting portion 4.

Figure 2:
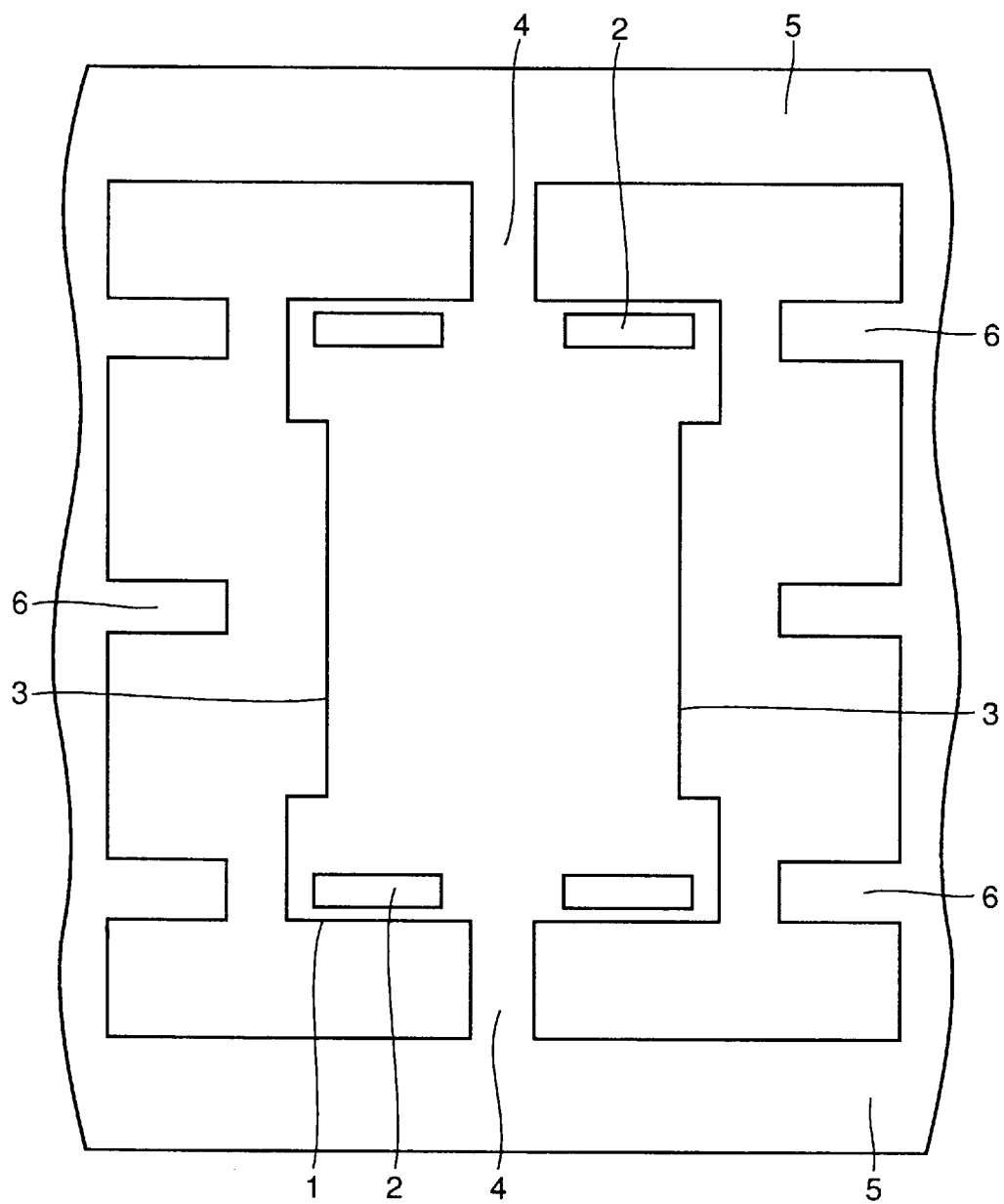
FIG. 2 is a plan view showing the details of the lead frame in accordance with the first embodiment of the present invention.

Referring to FIG. 2, on both sides of a portion of die pad 1 connected to connecting portion 4, through holes 2 are provided. A notch 3 is provided on a side opposing to lead 6.

Figure 3:
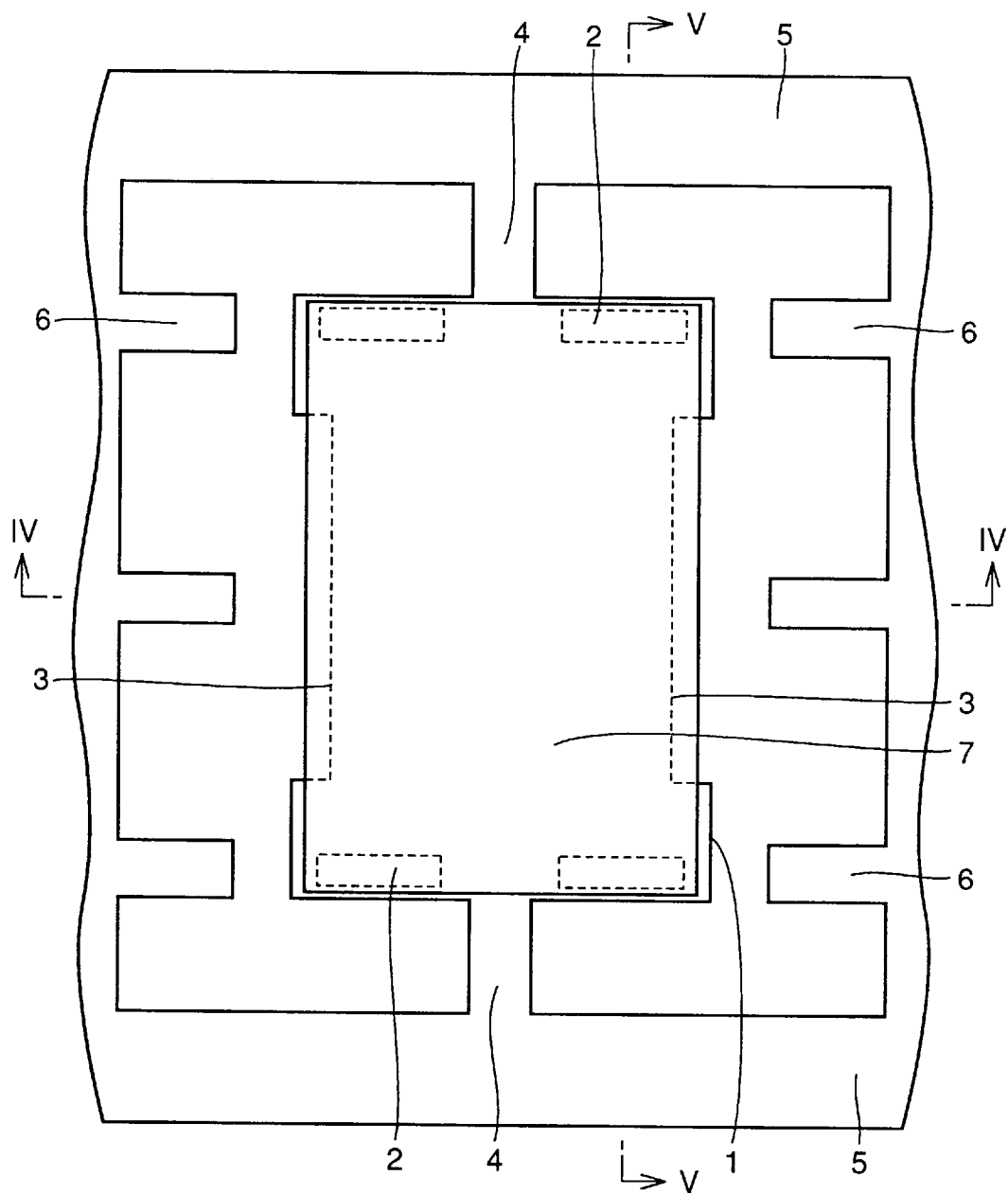
FIG. 3 is a plan view showing the lead frame in accordance with the first embodiment of the present invention on which a chip is mounted.

Referring to FIG. 3, die pad 1 has through holes 2 and notches 3. Chip 7 is mounted on die pad 1 such that the through holes 2 and notches 3 are positioned below the chip 7.

Figure 4:
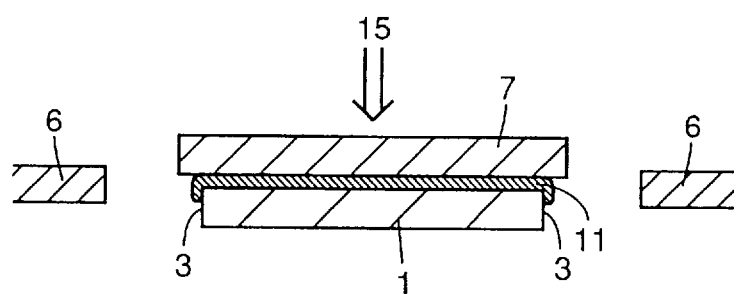
FIG. 4 is a cross section taken along the line IV—IV of FIG. 3.
Figure 5:
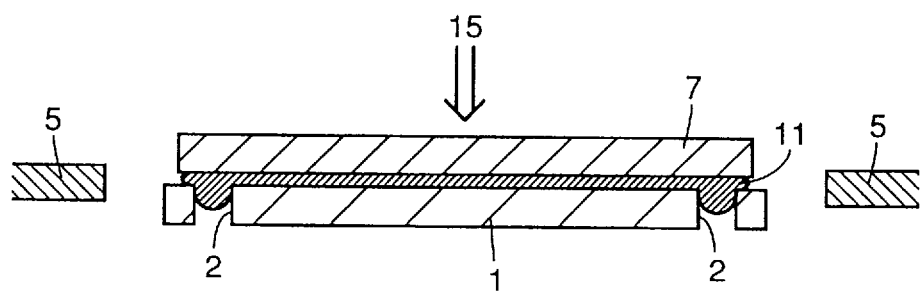
FIG. 5 is a cross section taken along the line V—V of FIG. 3.

Referring to FIGS. 4 and 5, die pad 1 and chip 7 are connected by means of solder 11.

In the lead frame structured as described above, referring to FIG. 4, when chip 7 is mounted on die pad 1 with solder 11 interposed, first, solder 11 is placed only at the central portion of die pad 1 and chip 7 is placed on solder 11. Thereafter, it is necessary to apply pressure to chip 7 in the direction of the arrow 15, so as to spread solder 11. At this time, pressure in the direction of the arrow 15 is applied to solder 11 which has reached notches 3, and solder 11 flows to the direction of notch 3. Therefore, solder 11 does not scatter to the leads 6.

Referring to FIG. 5, as in FIG. 4, when pressure in the direction of the arrow 15 is applied to chip 7, solder 11 flows to the through holes 2. Therefore, solder 11 does not scatter to frame 5.

Figure 6:
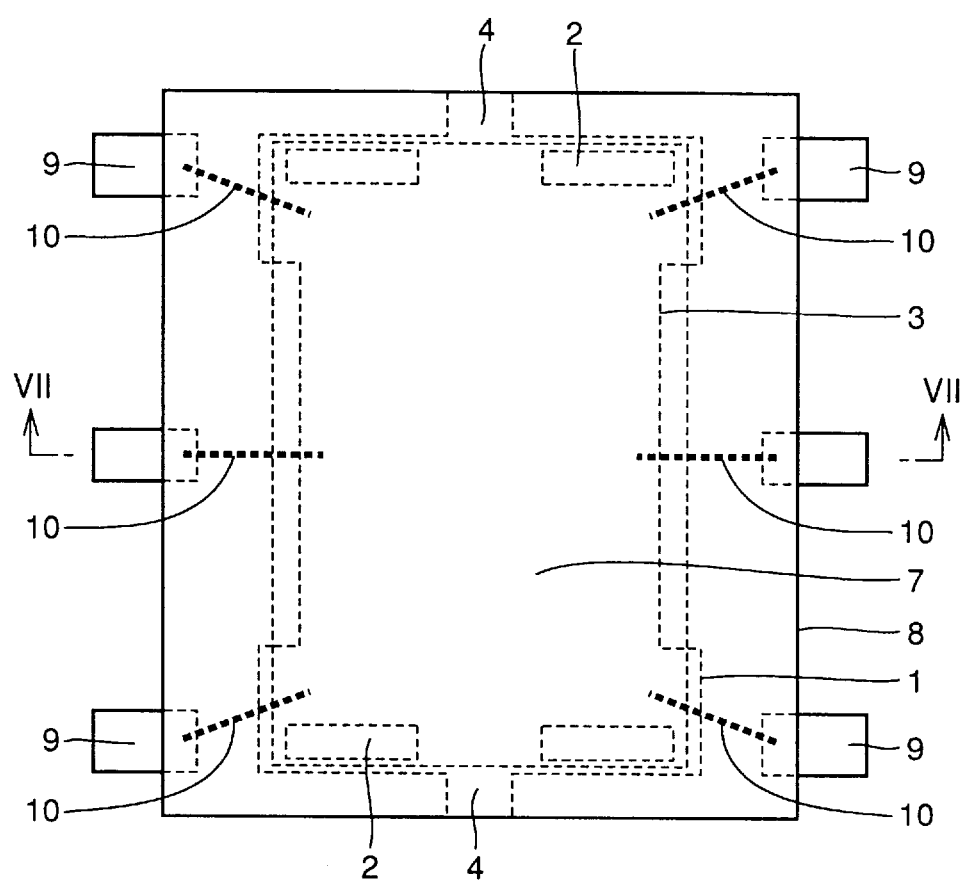
FIG. 6 is a plan view showing a semiconductor device using a die pad shown in the first embodiment of the present invention.

Referring to FIG. 6, a chip 7 is mounted on a die pad 1 which has through holes 2 and notches 3. Gold wires 10 are provided to electrically connect chip 7 and leads 9. Resin 8 is provide for covering part of the lead terminals 9, die pad 1, chip 7 and gold wires 10.

Figure 7:
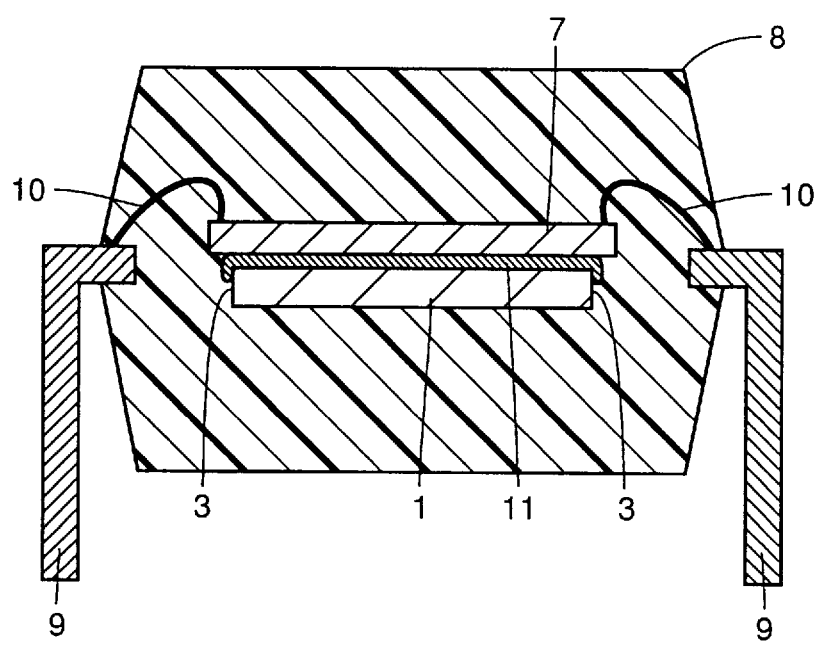
FIG. 7 is a cross section taken along the line VII—VII of FIG. 6.

Referring to FIG. 7, chip 7 is mounted on die pad 1 with solder 11 interposed.

In the semiconductor device structured in the above described manner, when chip 7 is mounted on die pad 1, solder 11 connecting die pad 1 with chip 7 flows to notches 3. Therefore, solder 11 is not adhered on lead terminals 9. Therefore, chip 7 and lead terminals 9 can be surely coupled to gold wires 10, and hence production yield of the semiconductor device can be improved.

First Example for Comparison

Figure 8:
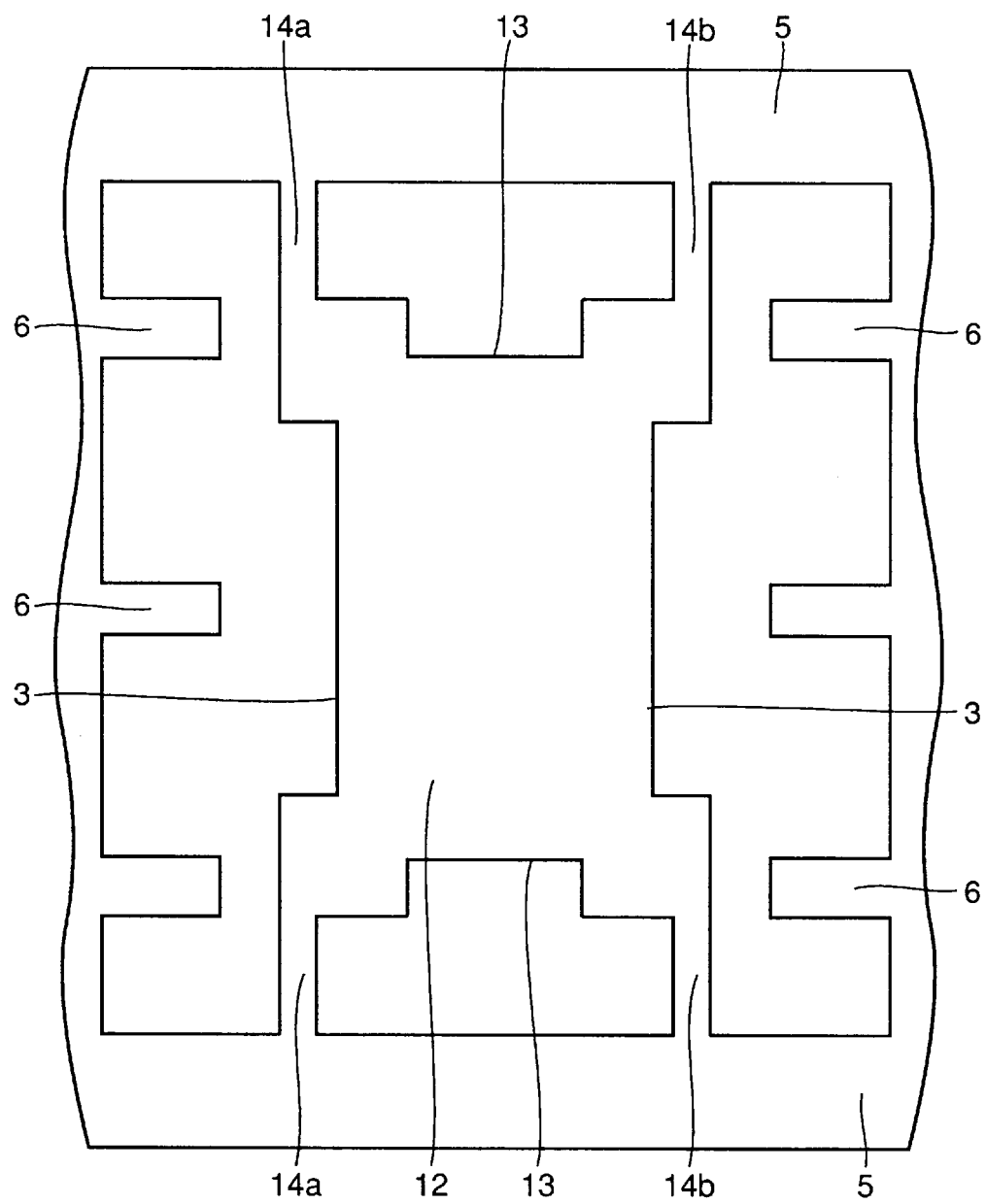
FIG. 8 is a plan view showing details of the lead frame in accordance with an example for comparison.

Referring to FIG. 8, a lead frame includes frames 5, leads 6, die pad 12 and connecting portions 14 and die pad 12 includes notches 3, 13. The lead frame in accordance with the first embodiment shown in FIG. 2 differs from the lead frame of the first example for comparison shown in FIG. 8 in that the connecting portion 14 is divided into first and second connecting portions 14a and 14b in the example of FIG. 8. Further, a notch 13 is provided instead of through hole 2.

Figure 9:
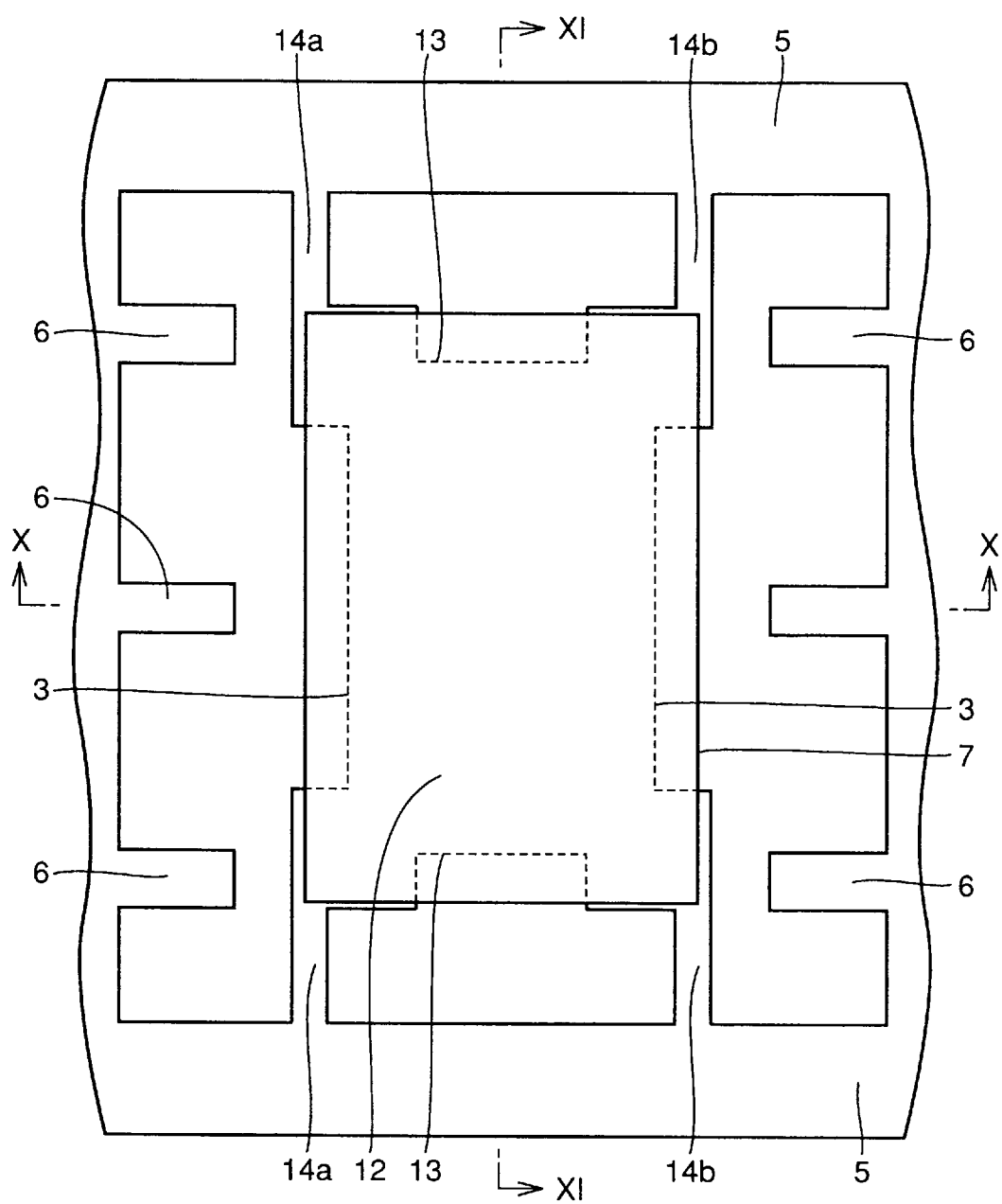
FIG. 9 is a plan view showing the lead frame in accordance with the example for comparison on which a chip is mounted.

Referring to FIG. 9, chip 7 is mounted on die pad 12 such that it is placed on notches 3 and 13.

Figure 10:
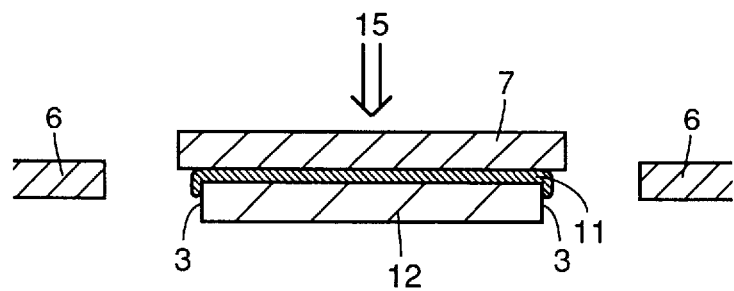
FIG. 10 is a cross section taken along the line X—X of FIG. 9.
Figure 11:
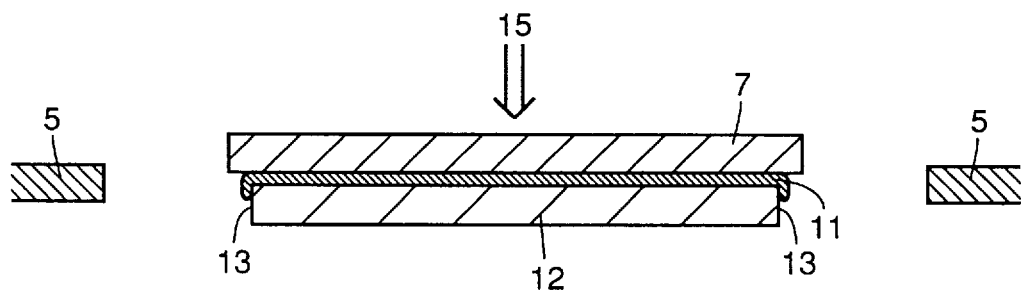
FIG. 11 is a cross section taken along the line XI—XI of FIG. 9.

Referring to FIGS. 10 and 11, die pad 12 and chip 7 are connected by solder 11.

In the lead frame structured in this manner, referring to FIG. 10, when chip 7 is mounted on die pad 12 with solder 11 interposed, first, solder 11 is placed at the central portion of die pad 12, and then chip 7 is placed on solder 11. Then, it is necessary to apply pressure in the direction of the arrow 15, so as to spread solder 11. At this time, solder 11 which has reached notches 3 flows down to the notches 3 by the pressure shown by the arrow 30. Therefore, solder 11 does not scatter to leads 6.

Referring to FIG. 11, similar to FIG. 10, when pressure is applied in the direction of arrow 15 to the chip 7, solder 11 also flows to notches 13. Therefore, solder 11 does not scatter to frames 5. However, connecting portion 14 cannot be placed at notch 7 and hence the portion of the die pad 12 on which connecting portion is arranged is limited. Further, since there is not a through hole in die pad 12, there is a problem of possible warp of die pad 12 when it is heated.

Second Embodiment

Figure 12:
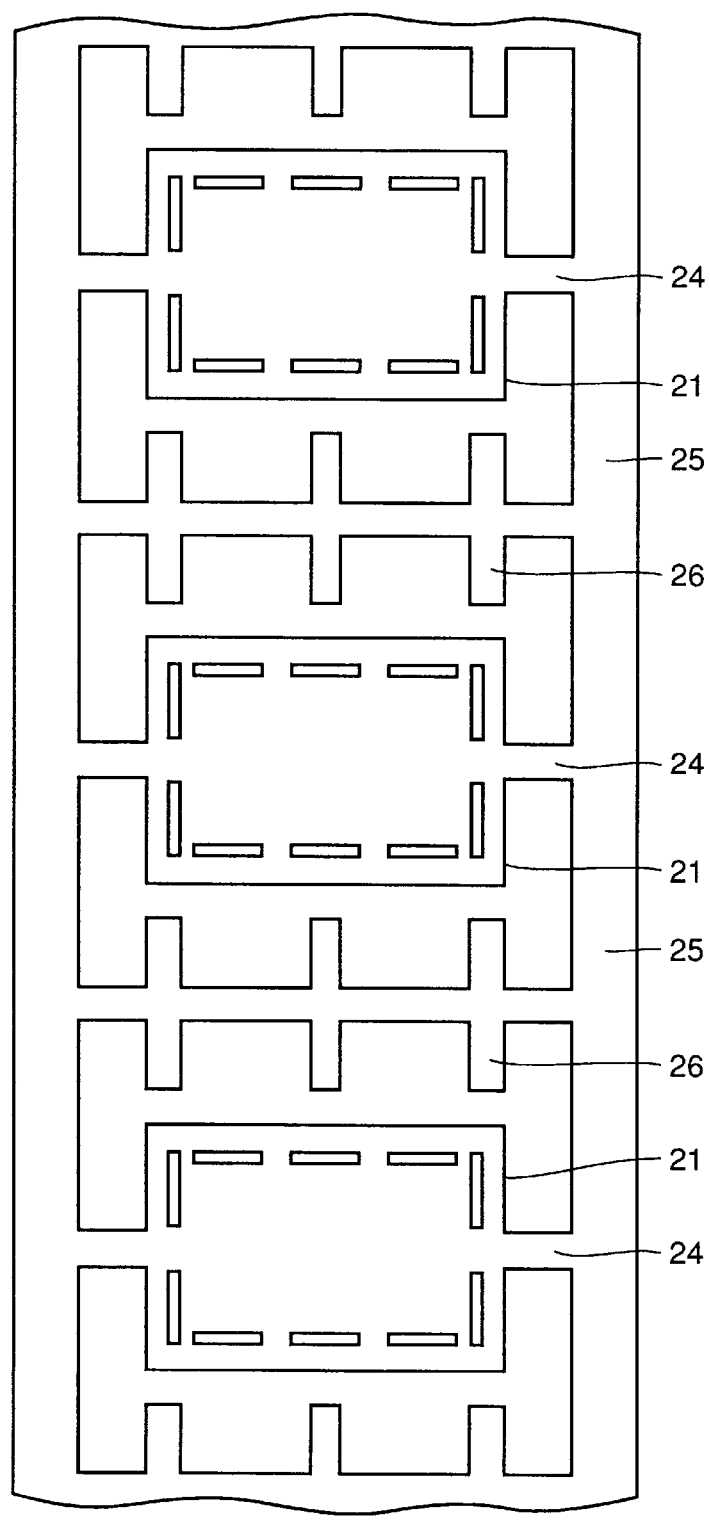
FIG. 12 is a plan view showing a lead frame in accordance with a second embodiment of the present invention.

Referring to FIG. 12, a lead frame includes die pads 21, frames 25, leads 26 and connecting portions 24. Though three die pads 21 are shown in the figure, the number of die pads 21 in the lead frame is not limited. A plurality of die pads 21 are positioned aligned in one direction between two frames 25. Leads 26 are arranged opposing to die pad 21. Though only six leads 26 are shown, the number of leads 26 is not limited. Die pad 21 is connected to frame 25 by connecting portion 24.

Figure 13:
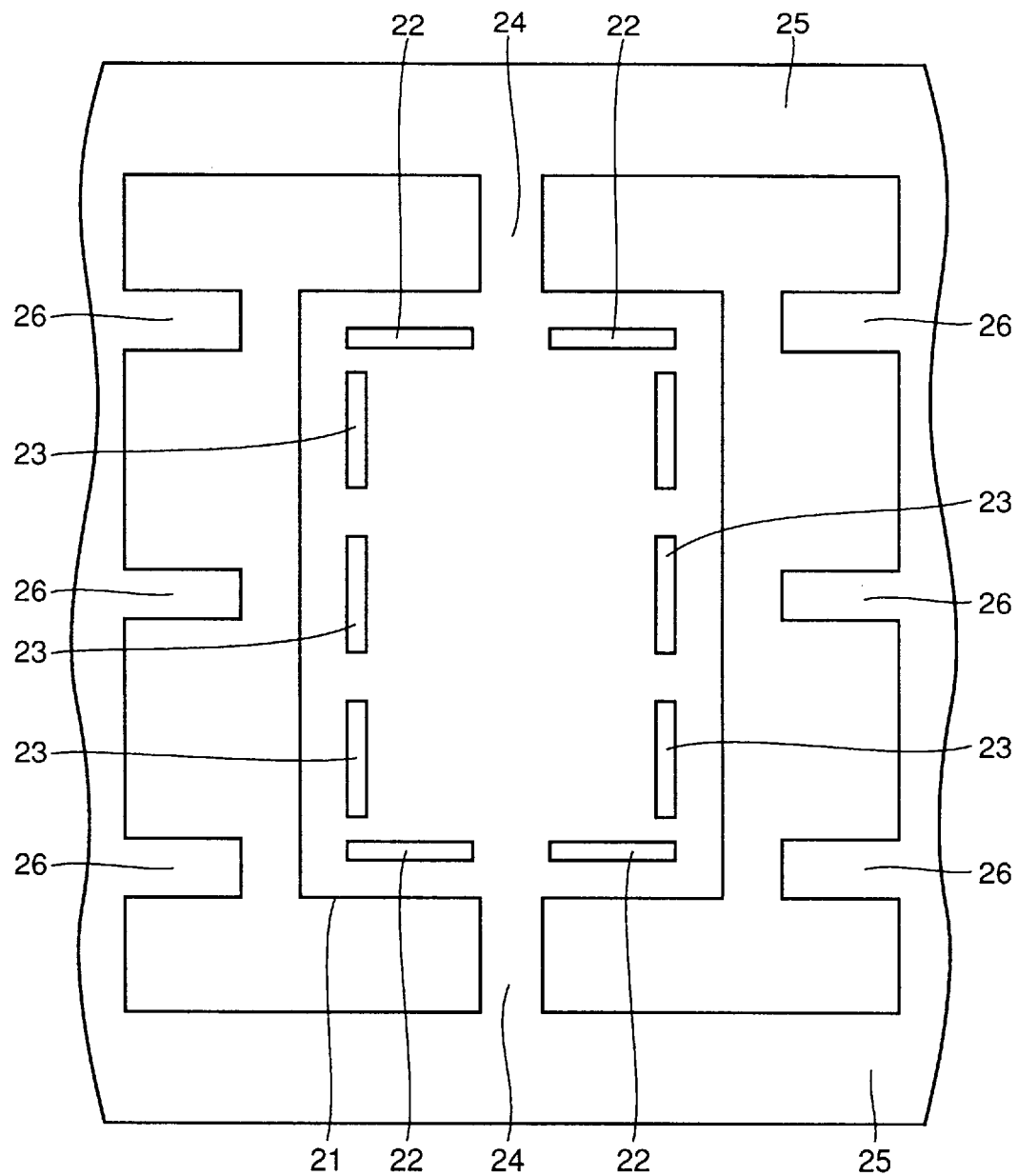
FIG. 13 is a plan view showing details of the lead frame in accordance with the second embodiment of the present invention.

Referring to FIG. 13, die pad 21 includes first through holes 23 and second through holes 22. The first through holes 23 extend along a side opposing to lead 26. The second through holes 22 are provided on both sides of the portion of die pad 21 which is connected to connecting portion 24.

Figure 14:
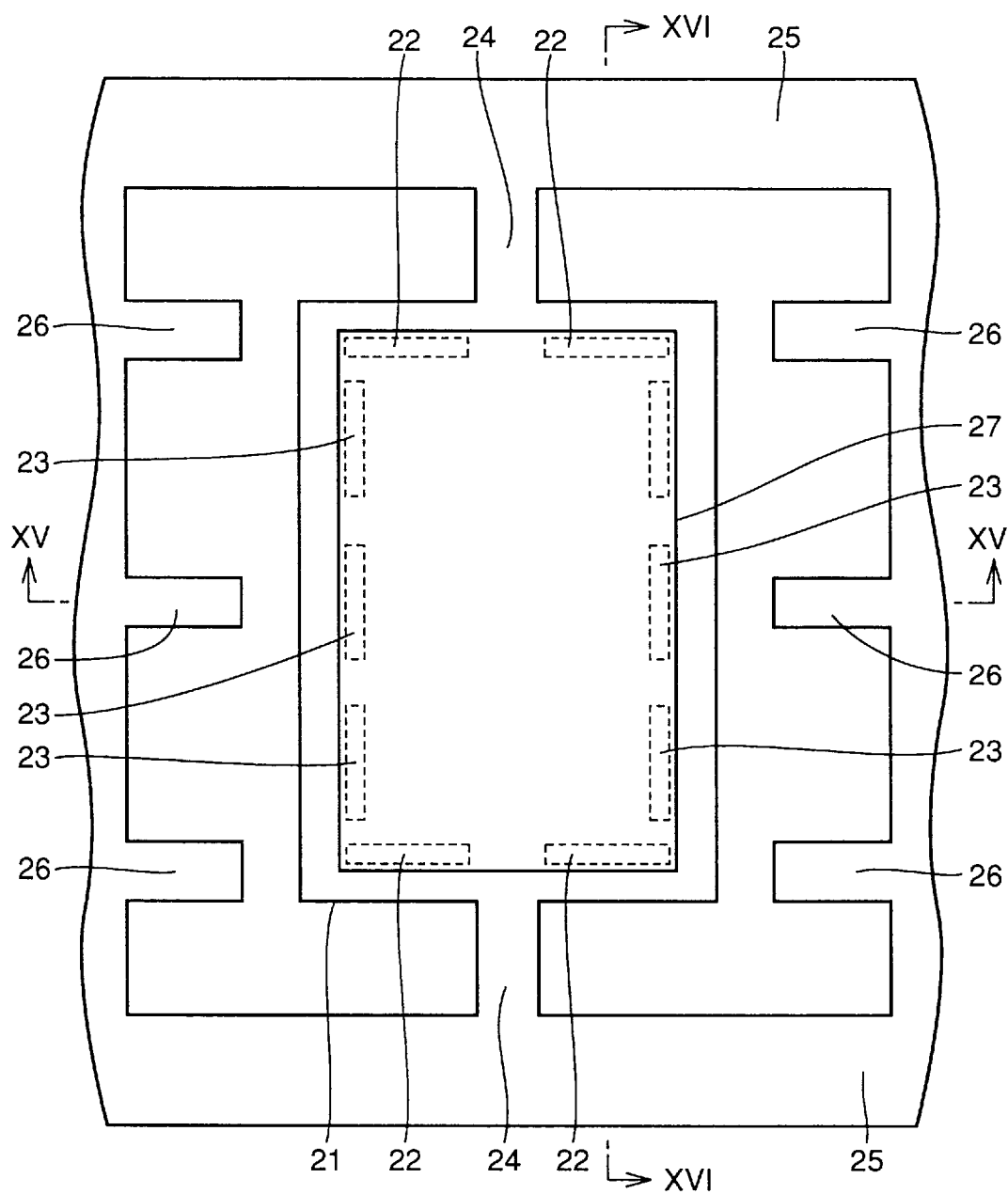
FIG. 14 is a plan view of the lead frame in accordance with the second embodiment of the present invention on which a chip is mounted.

Referring to FIG. 14, the lead frame includes die pad 21, frames 25, leads 26 and connecting portions 24, and die pad 21 has first and second through holes 23 and 22. Chip 27 is mounted on die pad 21 such that it is positioned on the first and second through holes 23 and 22.

Figure 15:
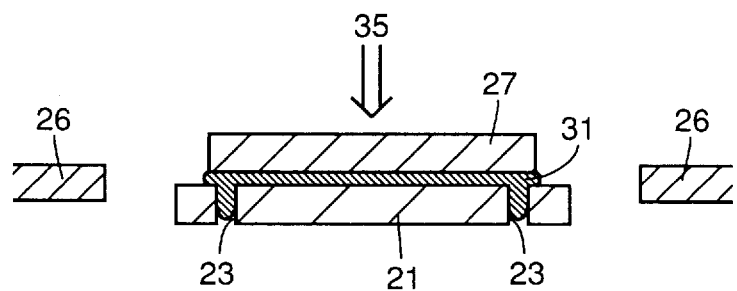
FIG. 15 is a cross section taken along the line XV—XV of FIG. 14.
Figure 16:
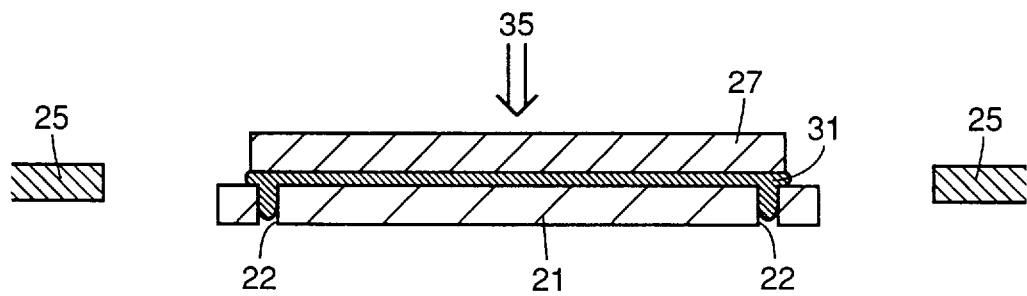
FIG. 16 is a cross section taken along the line XVI—XVI of FIG. 14.

Referring to FIGS. 15 and 16, die pad 21 is connected to chip 27 by solder 31.

In the lead frame structured as described above, referring to FIG. 15, when chip 27 is mounted on die pad 21 with solder 31 interposed, first, solder 31 is placed only at the central portion of die pad 21 and chip 27 is placed on solder 31. It is necessary to apply pressure in the direction of the arrow 35 so as to spread solder 31. At this time, solder 31 which has reached on the first through holes 23 enters the first through holes 23 by the pressure in the direction of arrow 35. Therefore, solder 31 does not scatter to leads 26.

Referring to FIG. 16, as in FIG. 15, when pressure in the direction of the arrow 35 is applied to chip 27, solder 31 flows to the second through holes 22. Therefore, solder 31 does not scatter to the frames 25.

Figure 17:
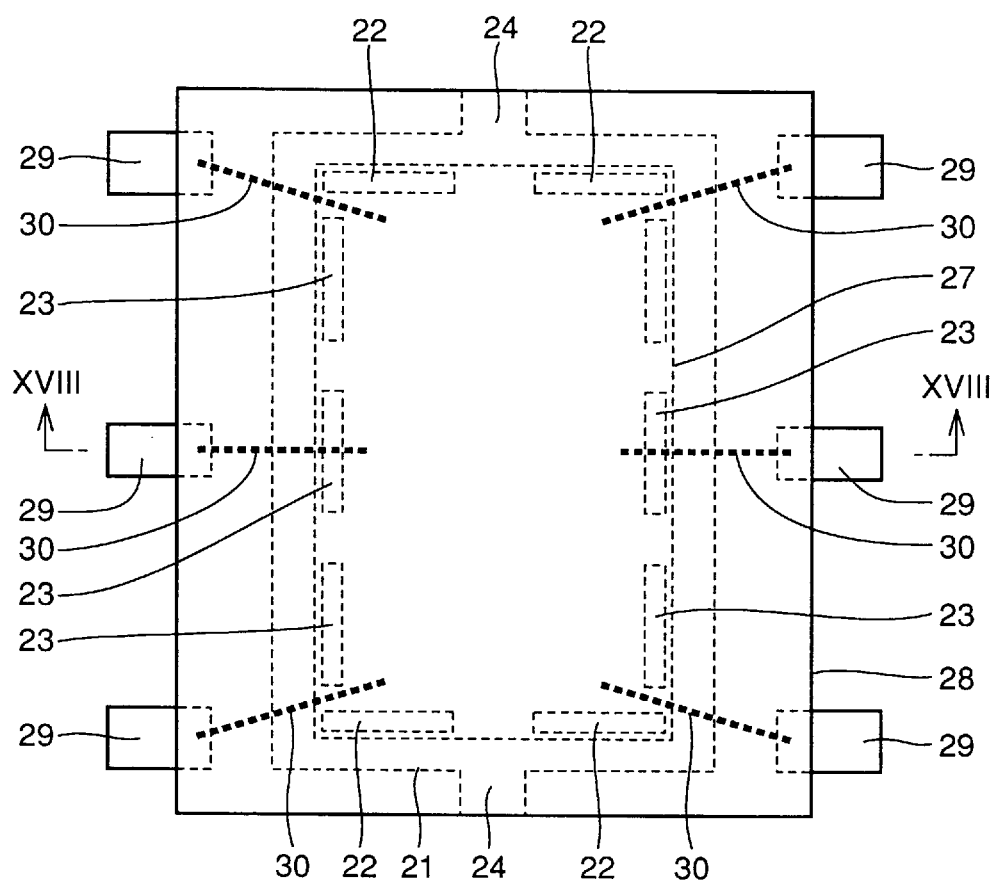
FIG. 17 is a plan view of a semiconductor device using the die pad shown in the second embodiment of the present invention.

Referring to FIG. 17, a semiconductor device includes die pad 21, connecting portions 24, chip 27, gold wires 30, lead terminals 29 and resin 28. Chip 27 is mounted on die pad 21. Gold wires 30 are provided for electrically connecting lead terminals 29 and chip 27. Die pad 21 has first and second through holes 23 and 22. The first and second through holes 23 and 22 are provided to be positioned below chip 27. Resin 28 covers part of lead terminals 29, die pad 21, connecting portions 24, chip 27 and gold wires 30.

Figure 18:
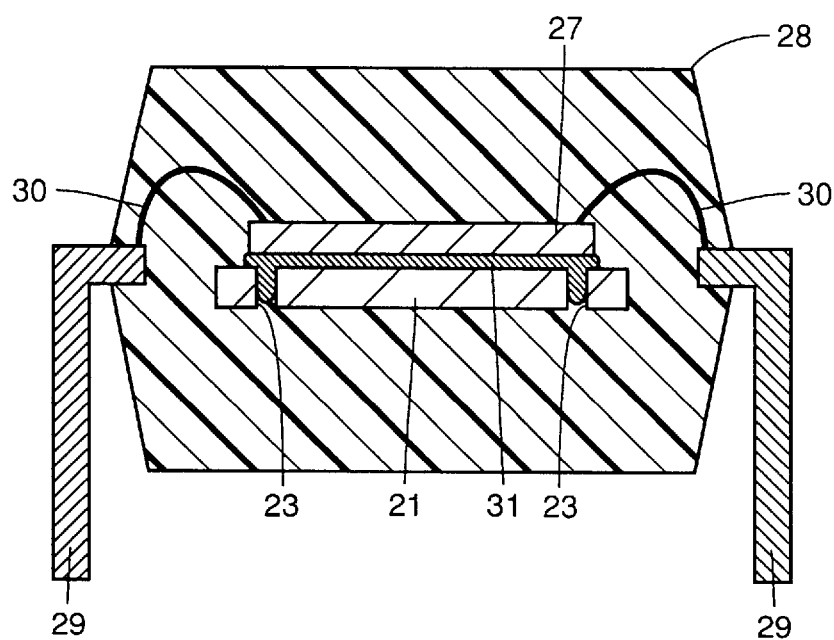
FIG. 18 is a cross section taken along the line XVII–XVIII of FIG. 17.

Referring to FIG. 18, die pad 21 and chip 27 are connected by solder 31.

In the semiconductor device structured as described above, when chip 27 is mounted on die pad 21, solder 31 connecting die pad 21 and chip 27 flows to the first through holes 23. Therefore, solder 31 does not adhere to lead terminals 29. Therefore, chip 27 and lead terminals 29 can be surely coupled by gold wires 30, and production yield of the semiconductor device can be improved.

Second Example for Comparison

Figure 19:
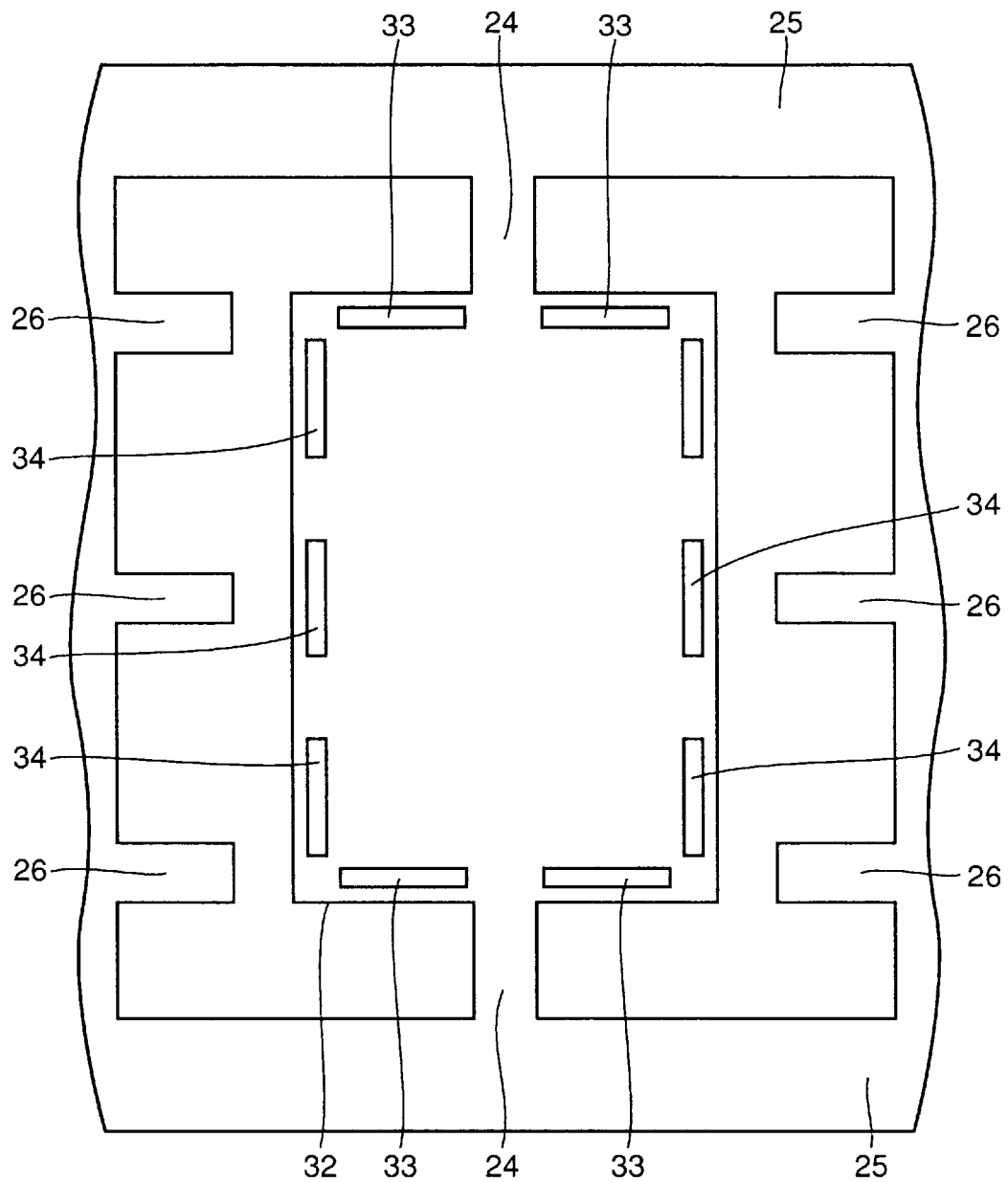
FIG. 19 is a plan view showing details of the lead frame in accordance with a second example for comparison.

Referring to FIG. 19, a lead frame includes die pad 32, frames 25, leads 26 and connecting portion 24. Leads 26 are arranged opposing to die pad 32. Die pad 32 is connected to frames 25 by connecting portions 24. Die pad 32 includes first and second through holes 34 and 33. The first through holes 34 are arranged opposing to leads 26. The second through holes 33 are arranged on both sides of the portion of die pad 32 which is connected to connecting portions 24.

Figure 20:
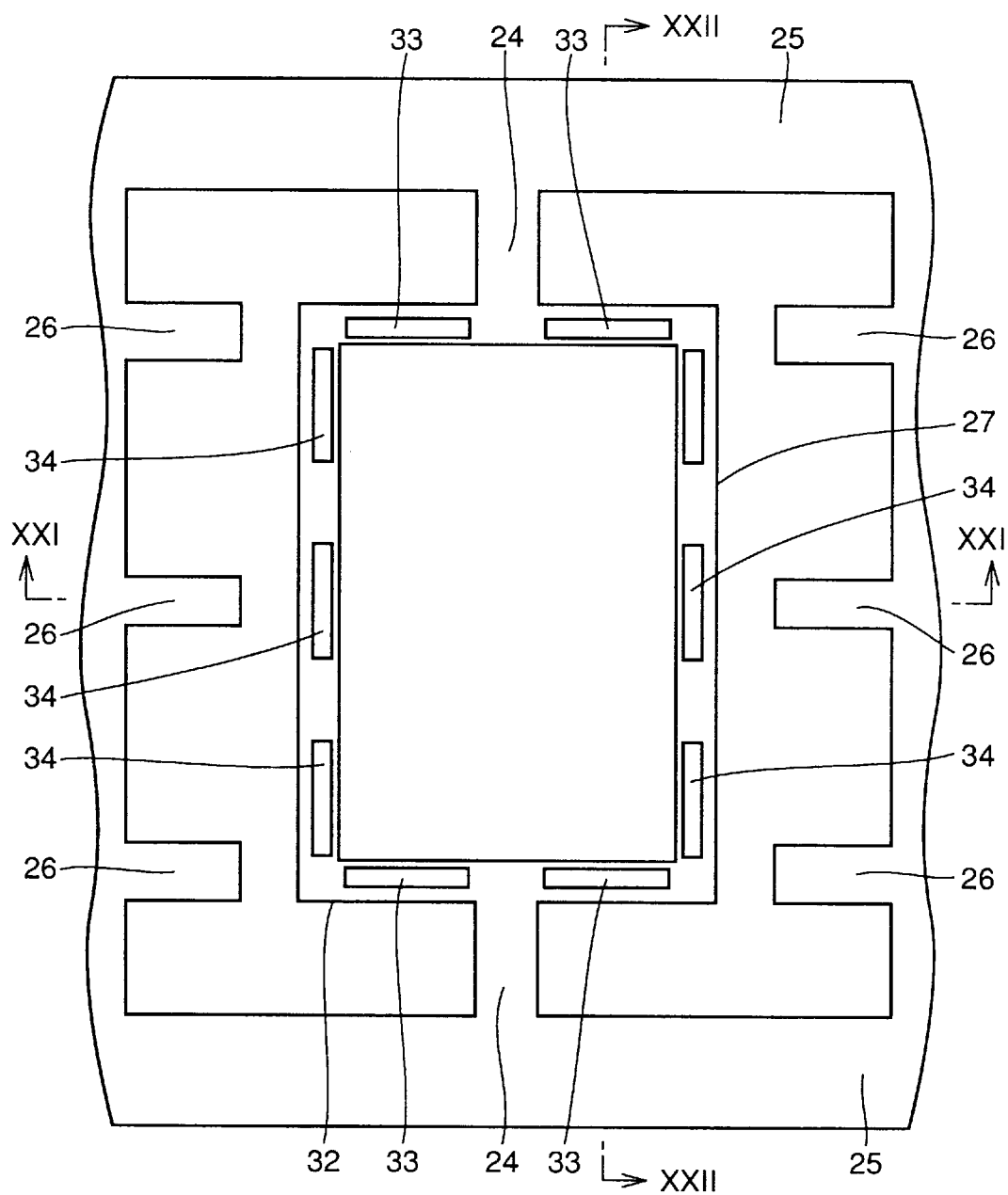
FIG. 20 is a plan view of the lead frame in accordance with the second example for comparison on which a chip is mounted.

Referring to FIG. 20, the lead frame includes die pad 32, frames 25, leads 26 and connecting portions 24, and die pad 32 includes first and second through holes 34 and 33. Chip 27 is arranged on a region of die pad 32 which is surrounded by the first and second through holes 34 and 33.

Figure 21:
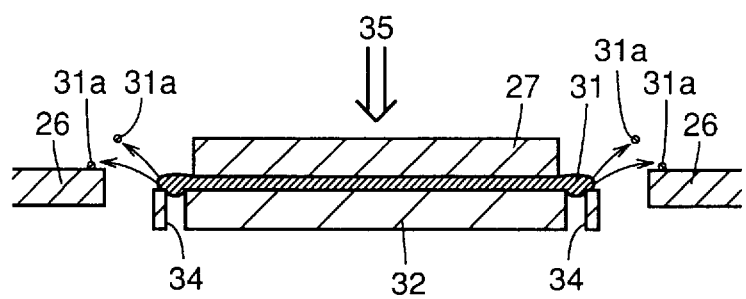
FIG. 21 is a cross section taken along the line XXI—XXI of FIG. 20.
Figure 22:
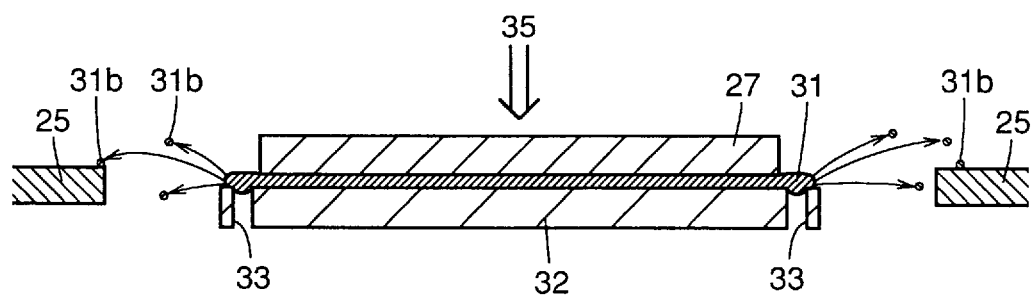
FIG. 22 is a cross section taken along the line XXII—XXII of FIG. 20.

Referring to FIGS. 21 and 22, die pad 32 is connected to chip 27 by solder 31.

In the lead frame structured as described above, referring to FIG. 21, when chip 27 is mounted on die pad 32 with solder 31 interposed, first, solder 31 is placed at the central portion of die pad 32, and chip 27 is placed on solder 31. Then, it is necessary to apply pressure as shown by arrow 35 so as to spread solder 31. At this time, chip 27 is not on the first through holes 34. Therefore, solder 31 which has reached the first through holes 34 does not enter the first through holes 34, since there is not the pressure shown by the arrow 35 applied thereto, and hence part of the solder 31a adheres to leads 26.

Referring to FIG. 22, when chip 27 is mounted on die pad 32 with solder 31 interposed, it is necessary to apply pressure as shown by arrow 35 as in FIG. 21, in order to spread solder 31. At this time, chip 27 does not exist on the second through holes 33. Therefore, solder 31 which has reached the second through holes 33 does not receive the pressure shown by the arrow 33. Therefore, solder does not enter the second through holes 33, and part of the solder 31b adheres to frames 25.

Third Embodiment

Figure 23:
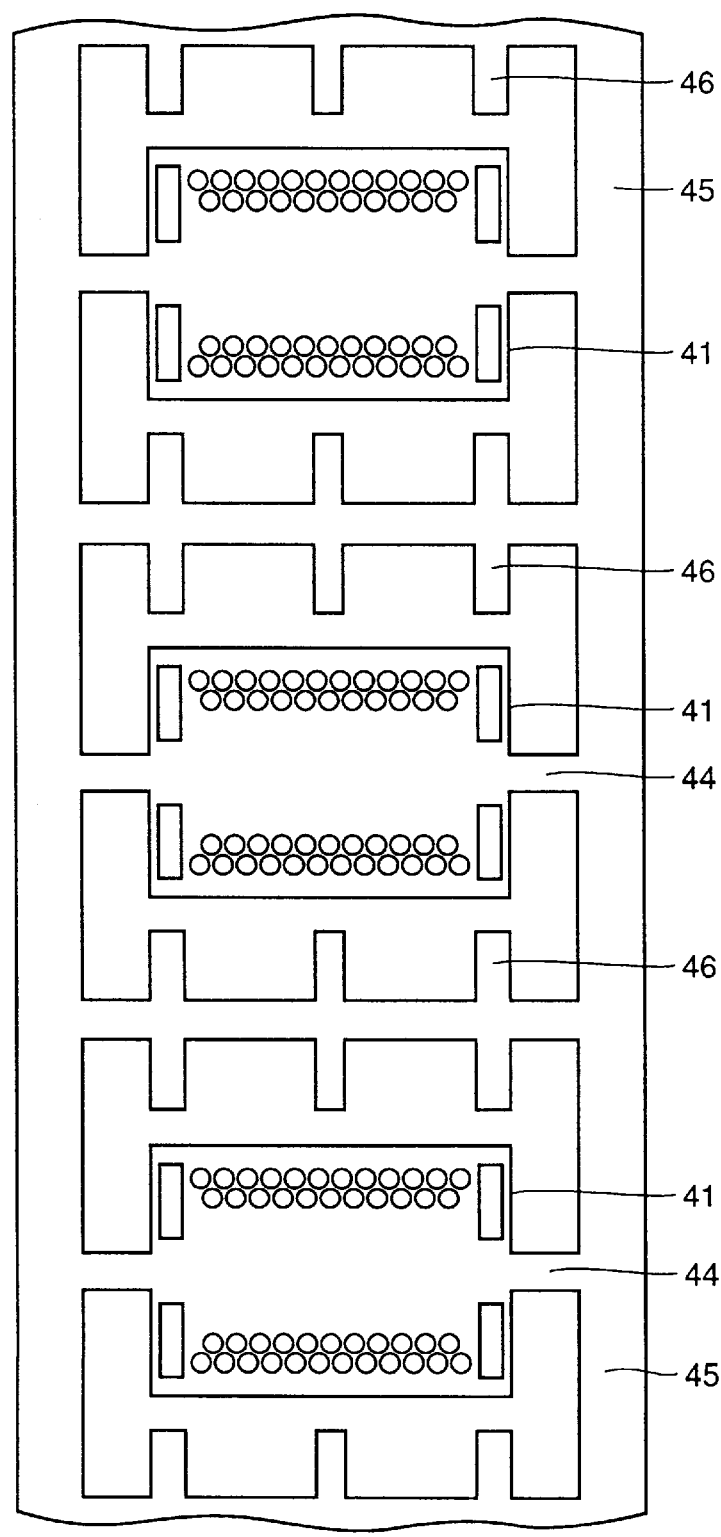
FIG. 23 is a plan view showing a lead frame in accordance with a third embodiment of the present invention.

Referring to FIG. 23, a lead frame includes die pads 41, frame 45, leads 46 and connecting portions 44. Though three die pads 41 are shown in the figure, the number of die pads 41 in the lead frame is not limited. A plurality of die pads 41 are positioned aligned in one direction between two frames 45. Die pads 41 is connected to frames 45 by connecting portions 44. Leads 46 are arranged opposing to die pads 41. Though only six leads 46 are shown, the number of leads 46 is not limited.

Figure 24:
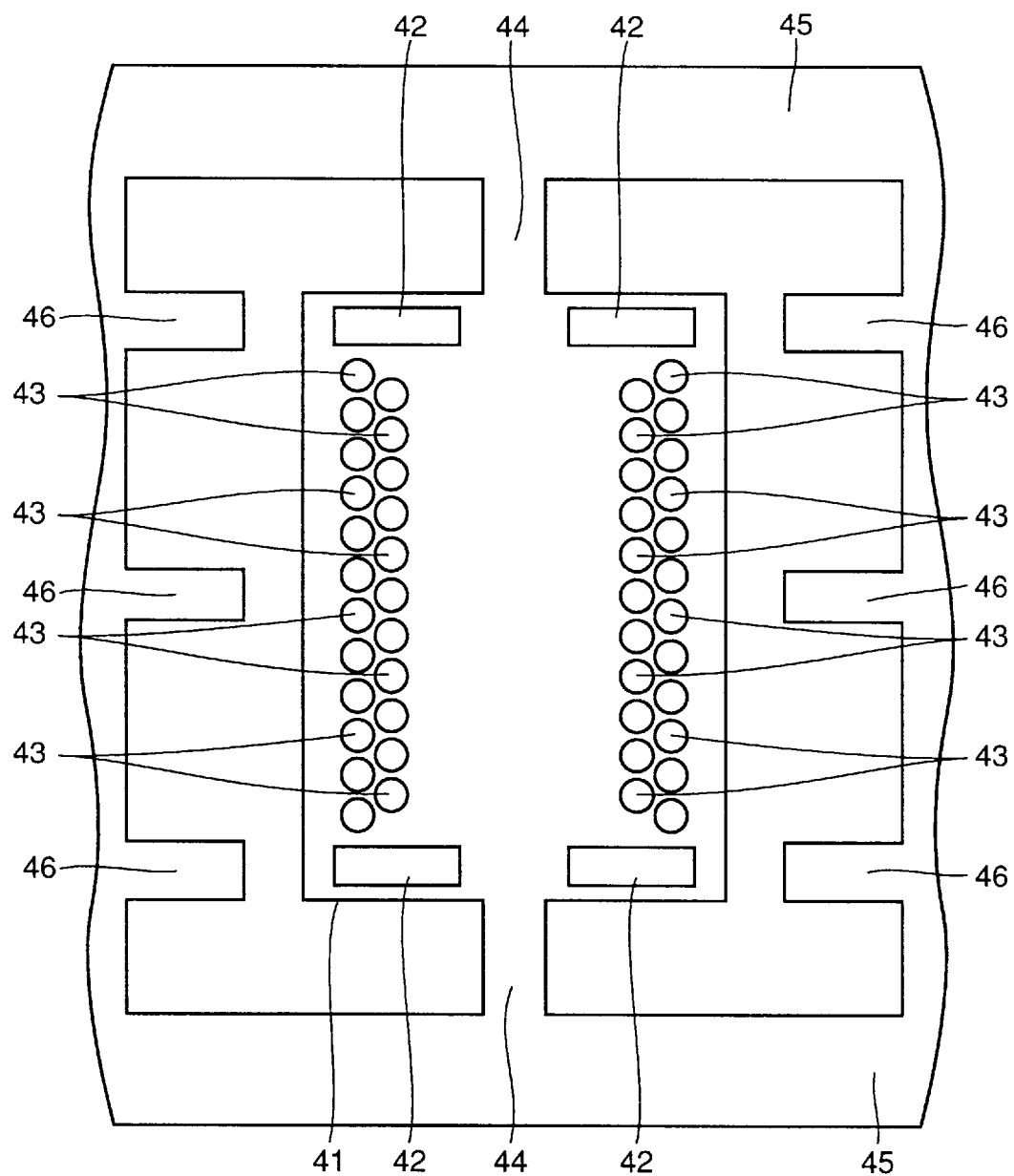
FIG. 24 is a plan view showing details of the lead frame in accordance with the third embodiment of the present invention.

Referring to FIG. 24, die pad 41 includes through holes 42 and recesses 43. Recesses 43 are provided in staggered manner opposing to leads 46. Though holes 42 are formed on both sides of that portion of die pad 41 which is connected to connecting portion 44.

Figure 25:
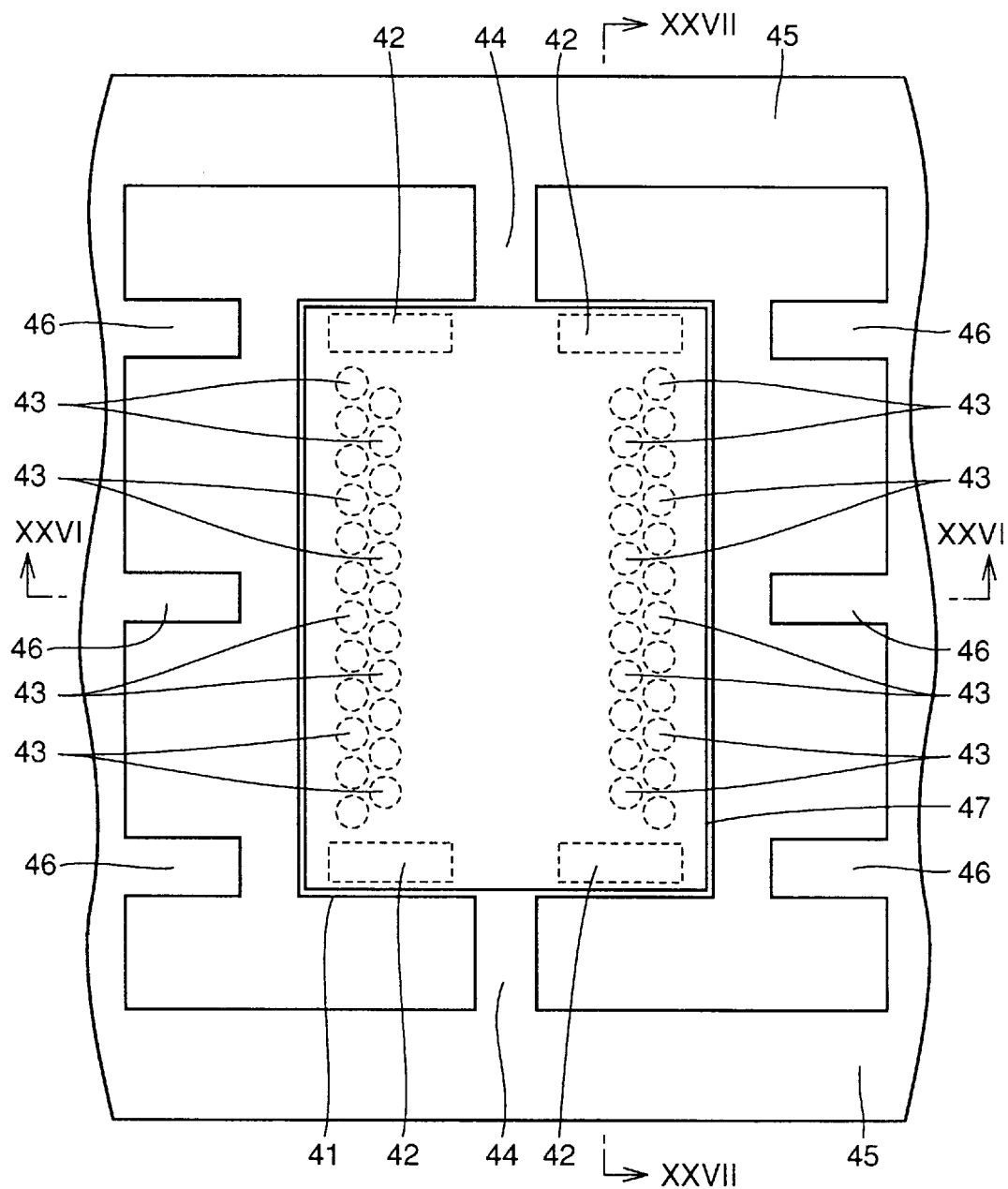
FIG. 25 is a plan view showing the lead frame in accordance with the third embodiment of the present invention on which a chip is mounted.

Referring to FIG. 25, chip 47 is mounted on die pad 41 such that it is positioned on through holes 42 and recesses 43.

Figure 26:
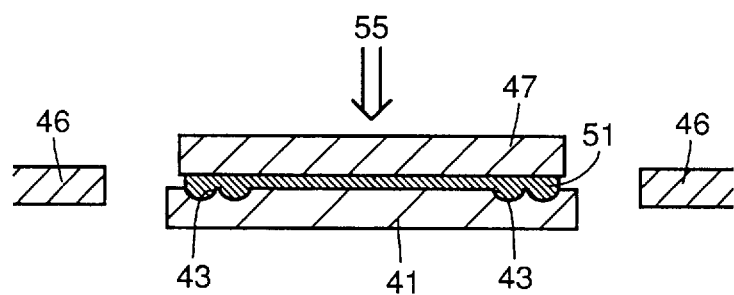
FIG. 26 is a cross section taken along the line XXVI—XXVI of FIG. 25.
Figure 27:
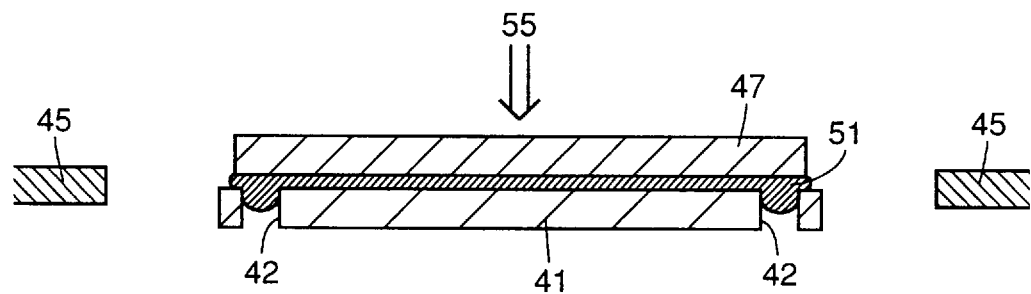
FIG. 27 is a cross section taken along the line XXVII—XXVII of FIG. 25.

Referring to FIGS. 26 and 27, die pad 41 is connected to chip 47 by solder 51.

In the lead frame structured as described above, referring to FIG. 26, when chip 47 is mounted on die pad 41 with solder 51 interposed, first, solder 51 is placed only at the central portion of die pad 41, and chip 47 is placed on solder 51. Then, it is necessary to apply pressure as shown by arrow 53 in order to spread solder 51. At this time, solder 51 which has reached on recess 43 receives the pressure shown by the arrow 53, and hence it enters recesses 43 and not scattered to leads 46.

Referring to FIG. 27, when chip 47 is mounted on die pad 41 with solder 51 interposed, it is necessary to apply pressure as shown by the arrow 53 to chip 47, in order to spread solder 51, as in FIG. 26. At this time, solder 51 which has reached the through holes 42 receives the pressure shown by the arrow 53, and hence it enters through holes 42. Therefore, solder 51 does not scatter to frames 45.

Figure 28:
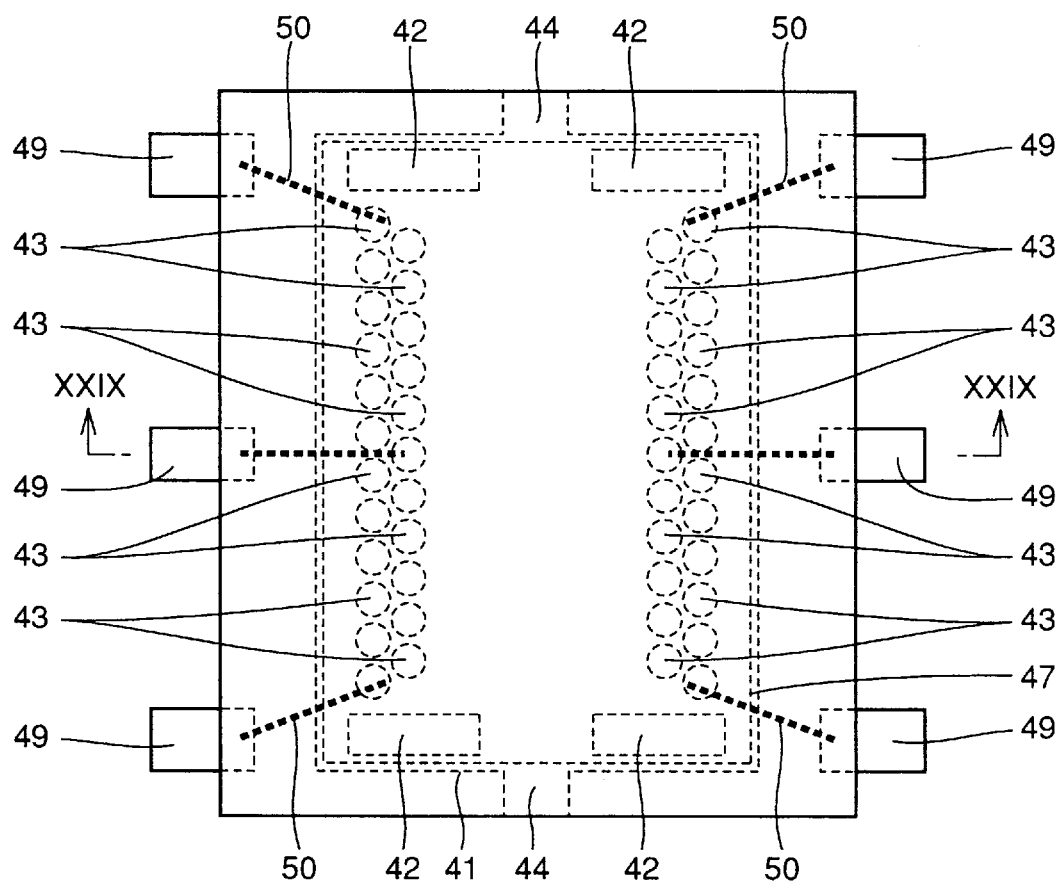
FIG. 28 is a plan of the semiconductor device using the die pad shown in the third embodiment of the present invention.

Referring to FIG. 28, a semiconductor device includes die pad 41, chip 47, lead terminals 49, gold wires 50, connecting portions 44 and resin 48. Chip 47 is mounted on die pad 41. Lead terminals 49 are electrically connected to chip 47 by gold wires 50. Part of lead terminals 49, die pad 41, connecting portions 44, chip 47 and gold wire 50 are covered with resin 48. Die pad 41 is provided with through holes 42 and recesses 43. Through holes 42 and recesses 43 are positioned opposing to chip 47.

Figure 29:
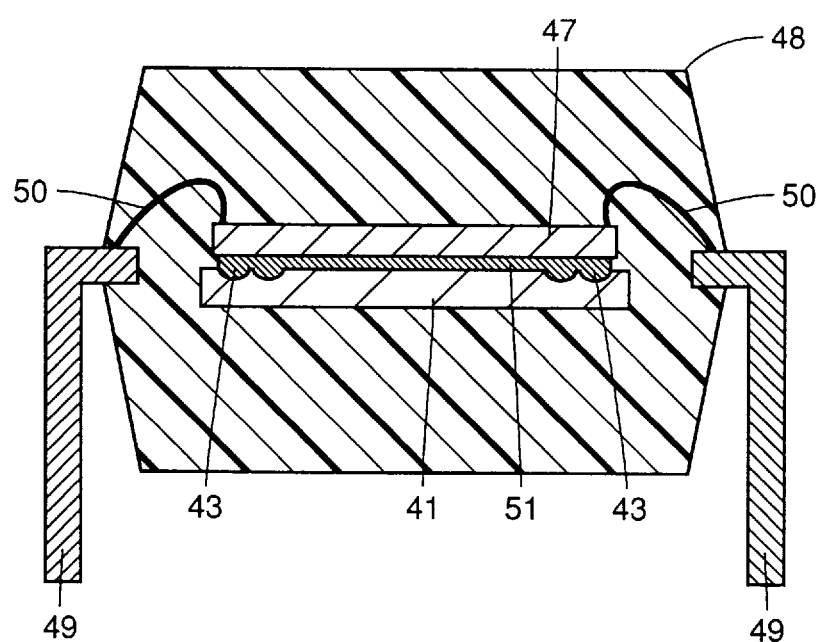
FIG. 29 is a cross section taken along the line XXIX—XXIX of FIG. 28.
Figure 30:
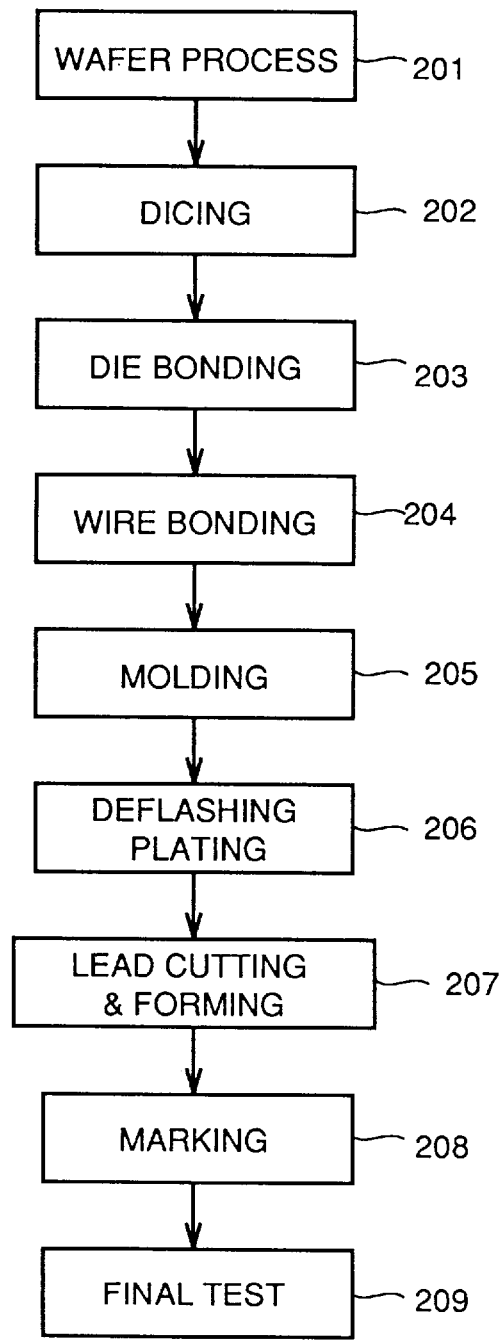
FIG. 30 shows steps of manufacturing a conventional semiconductor device.
Figure 32:
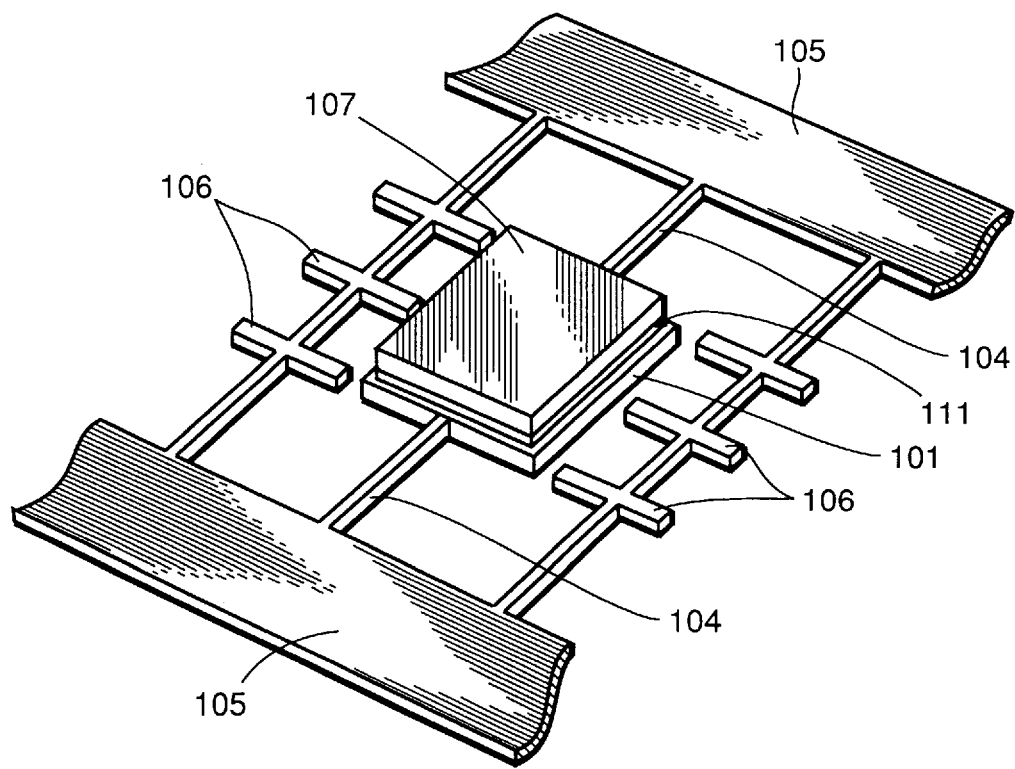
FIG. 32 is a perspective view showing the step of die bonding of the conventional method of manufacturing a semiconductor device.
Figure 33:
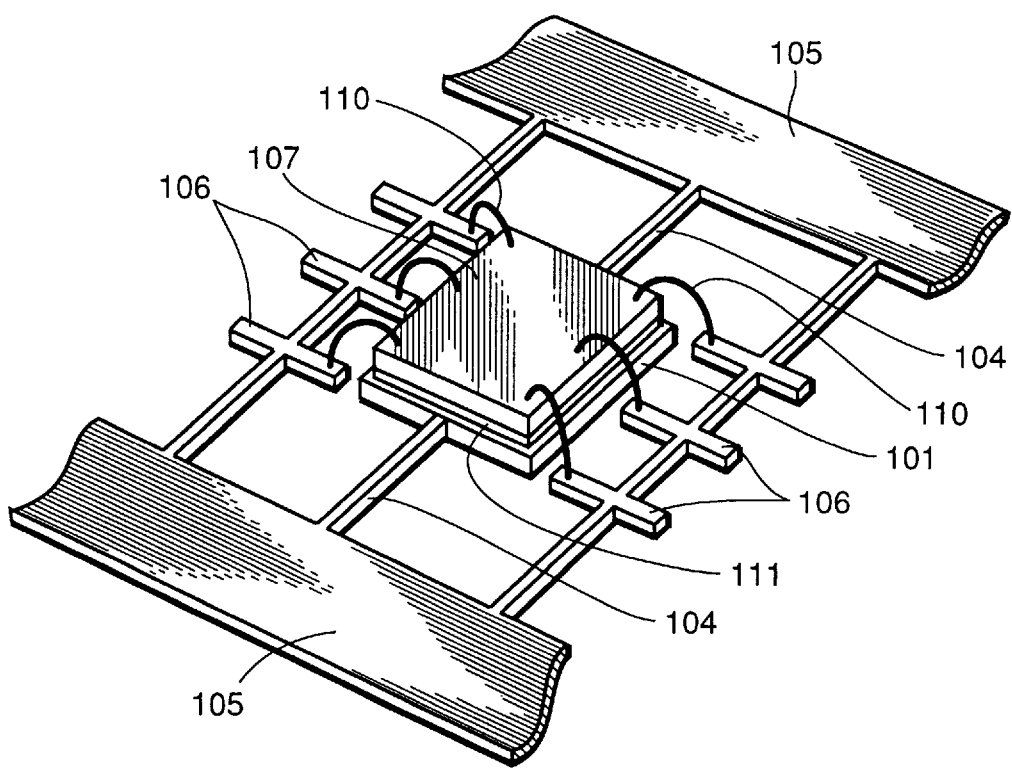
FIG. 33 is a perspective view showing the step of wire bonding in the conventional method of manufacturing a semiconductor device.
Figure 34:
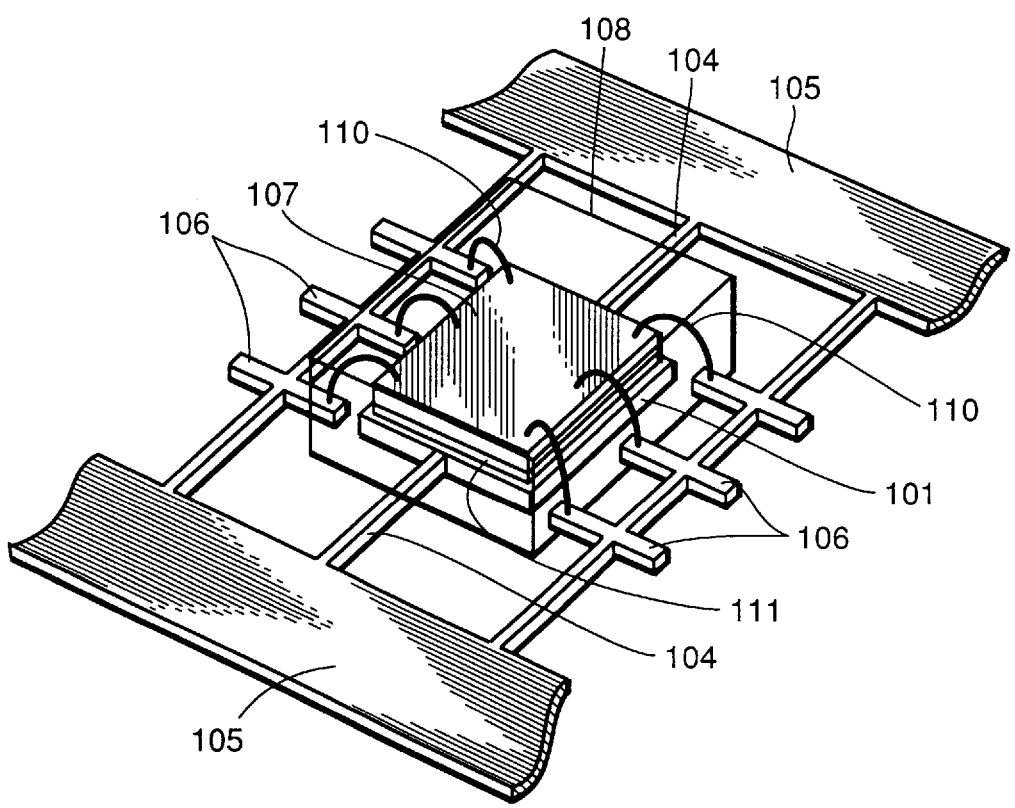
FIG. 34 is a perspective view showing the step of molding of the conventional method of manufacturing a semiconductor device.
Figure 35:
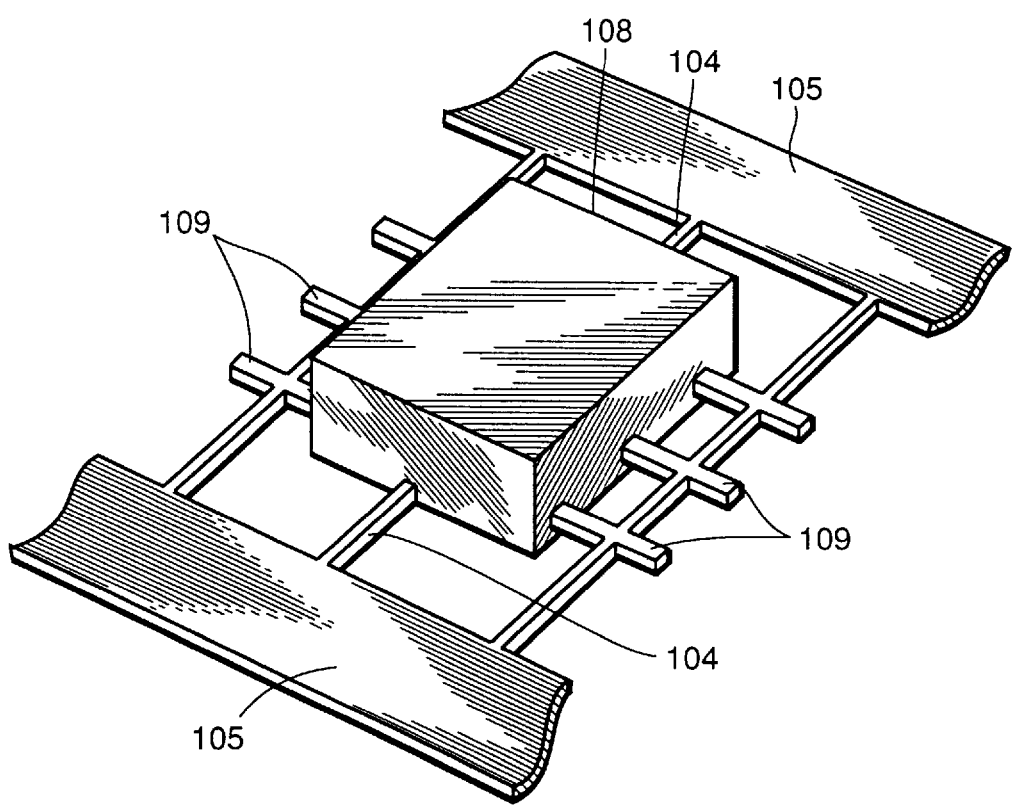
FIG. 35 is a perspective view showing the step of plating of the conventional method of manufacturing a semiconductor device.
Figure 36:
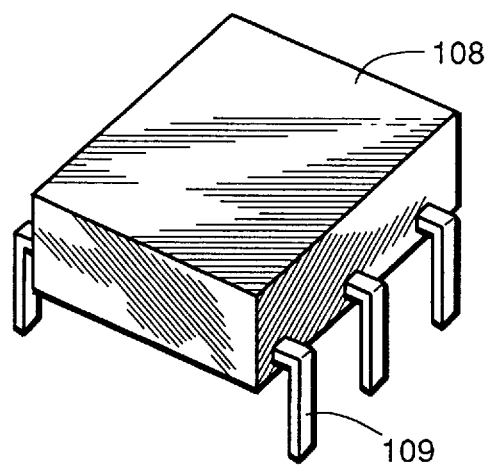
FIG. 36 is a perspective view showing the step of lead cutting and forming in the conventional method of manufacturing a semiconductor device.
Figure 37:
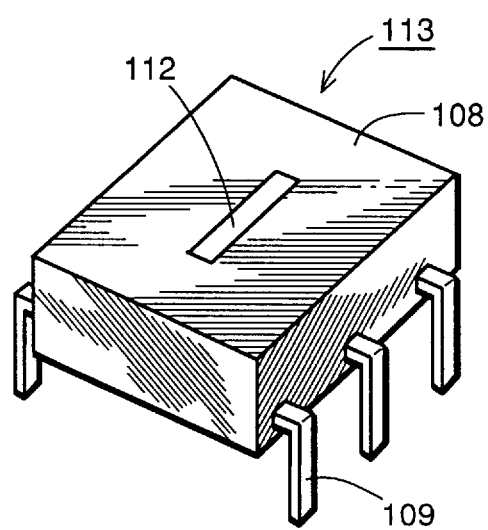
FIG. 37 is a perspective view showing the step of marking in the conventional method of manufacturing a semiconductor device.

Referring to FIG. 29, chip 47 is mounted on die pad 41 with solder 51 interposed. In the semiconductor device structured as described above, when chip 47 is mounted on die pad 41, solder 51 connecting die pad 41 to chip 47 flows to recesses 43. Therefore, solder 51 does not adhere to lead terminals 49. Therefore, chip 47 and lead terminals 49 can be surely coupled by gold wires 50, and hence production yield of the semiconductor device can be improved.

In the embodiments above, lead frame is prepared by a plate material of a copper alloy such as phosphor bronze or an iron alloy, such as 42 alloy which is etched to a necessary pattern or punched by using a metal mold. Though solder is used as an adhesive for connecting die pad and the chip in the above embodiments, similar effects can be obtained when a resin such as epoxy having low viscosity or polyimide is used. The embodiments disclosed are examples only and not limiting.

EXAMPLE 1

Figure 38:
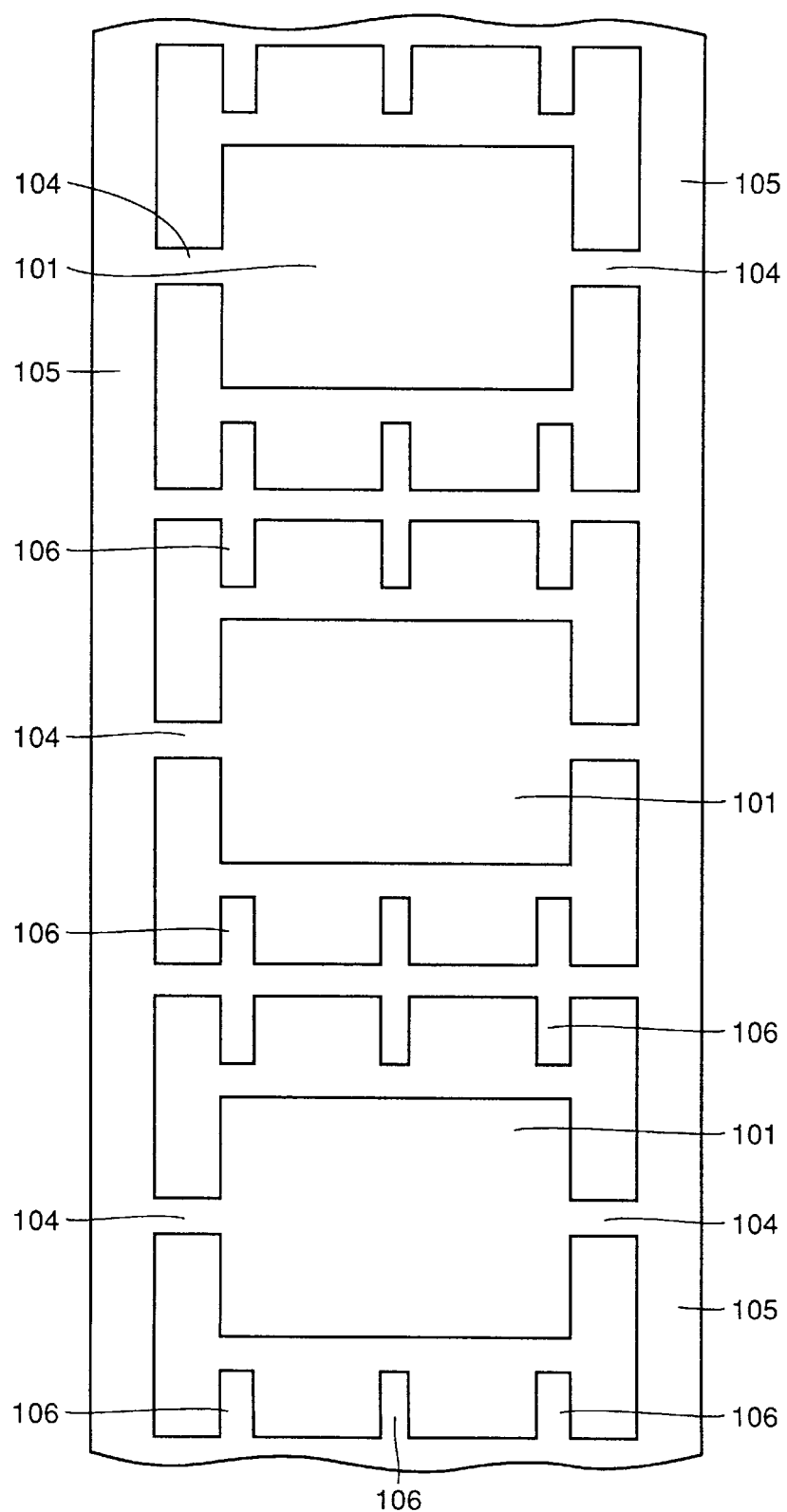
FIG. 38 is a plan view showing a conventional lead frame.
Figure 39:
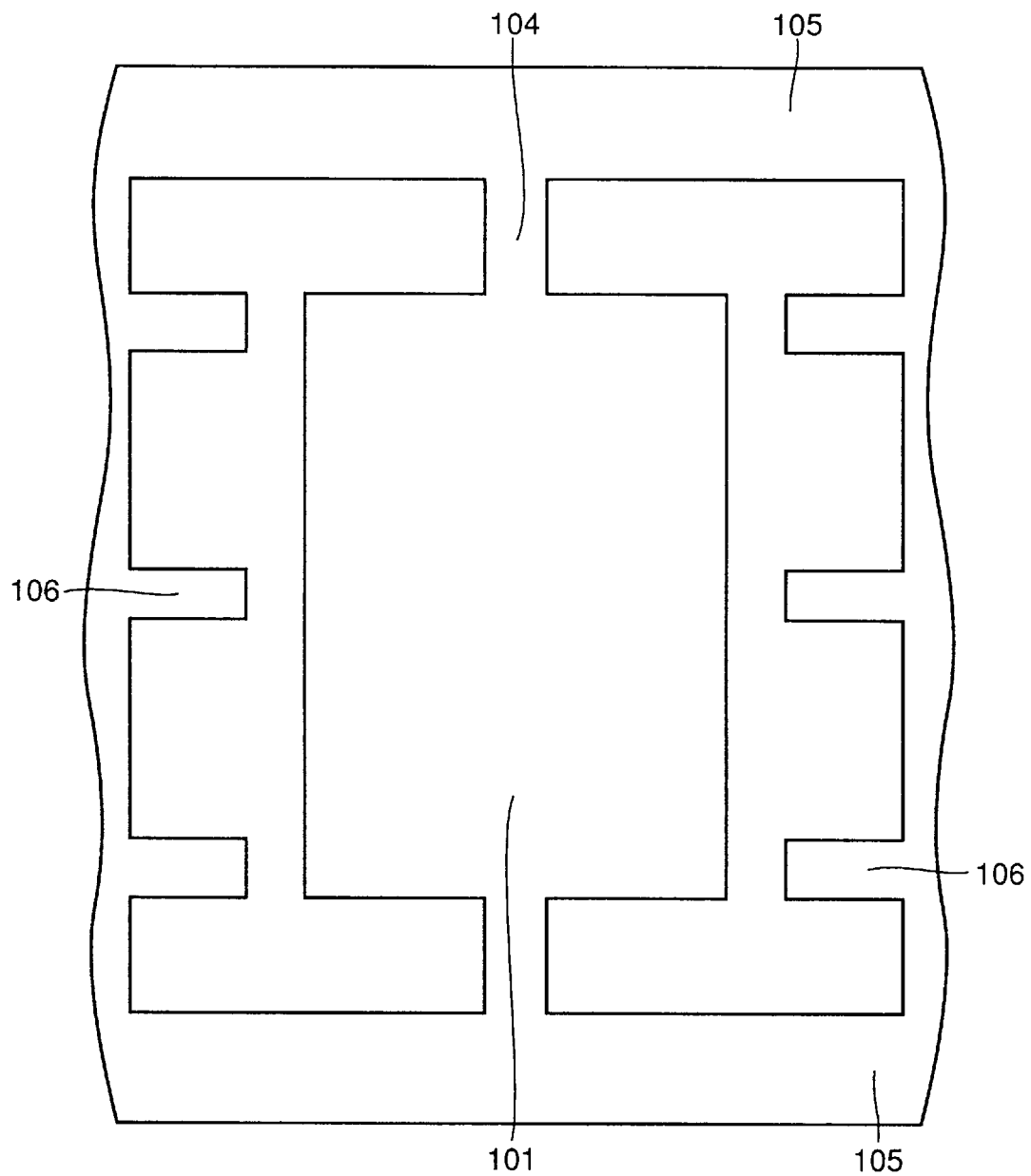
FIG. 39 is a plan view showing in detail the conventional lead frame.
Figure 40:
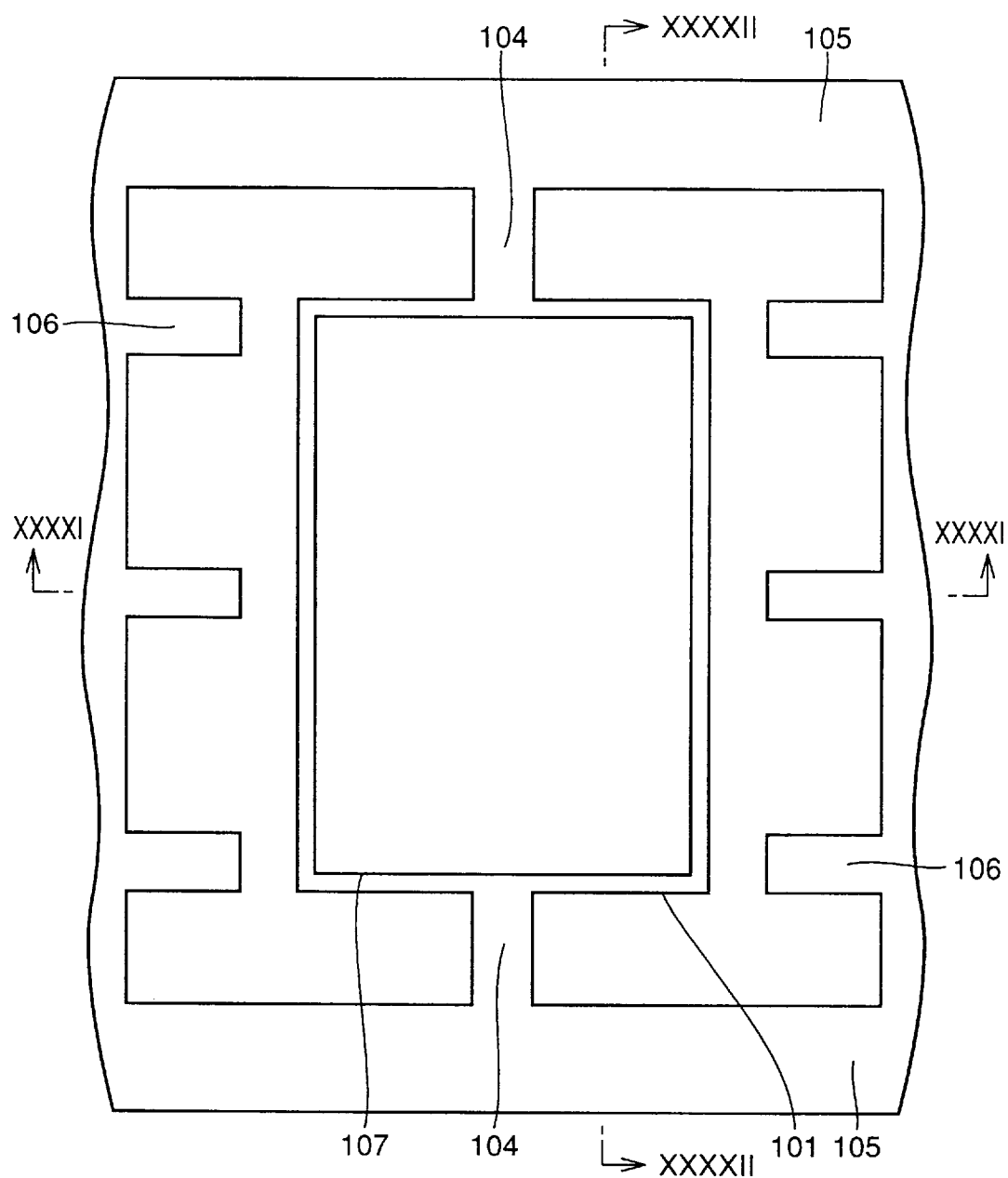
FIG. 40 is a plan view showing a conventional lead frame on which a chip is mounted.
Figure 41:
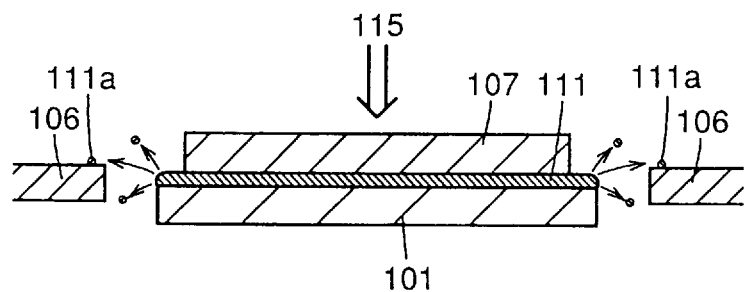
FIG. 41 is a cross section taken along the line XXXXI—XXXXI of FIG. 40.
Figure 42:
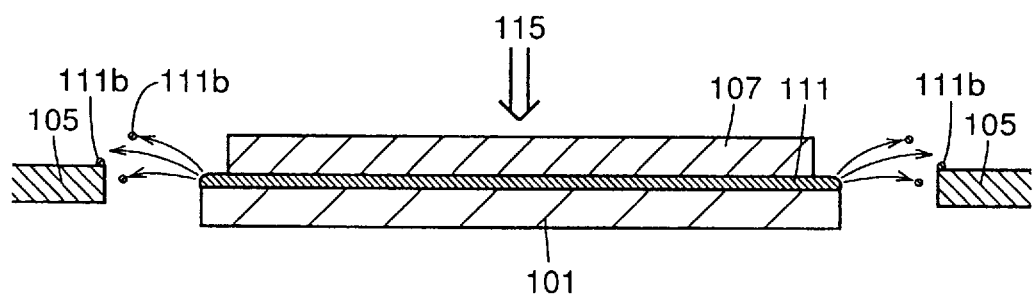
FIG. 42 is a cross section taken along the line XXXXII—XXXXII of FIG. 40.

650 chips were mounted on die pads of a conventional lead frame A shown in FIG. 38 and on a lead frame B shown in FIG. 1, and an experiment to see if solder adheres to the leads was performed in accordance with the following procedure.

(1) The same amount of solder was placed on the die pads of A and B in an atmosphere at 400° C. The solder was lead-tin alloy including 95% by weight of lead. Lead frame was formed of 42 alloy (iron alloy including 42% by weight of nickel).

(2) Chips were mounted on solder, and pressure of 80±5 g was applied so that the chips were adhered with pressure on die pads.

(3) Whether solder adhered to leads or not was determined by visual inspection (inspection by microscope) for the 650 die pads of the frame A on which chips were mounted and 650 die pads of frame B on chips were mounted.

The result of inspection was as shown in Table 1 below.

TABLE 1

Result of Example 1

|  | Ratio of adhesion of solder on leads |
| --- | --- |
| Conventional lead frame A | 21.3% |
| Lead frame B of FIG. 1 | 0% |

EXAMPLE 2

650 chips were mounted on die pads of a conventional lead frame C shown in FIG. 38 and on a lead frame D shown in FIG. 12, and an experiment to see if solder adheres to the leads was performed in accordance with the following procedure.

(1) The same amount of solder was placed on the die pads of C and D in an atmosphere at 400° C. The solder was lead-tin alloy including 95% by weight of lead. Lead frame was formed of 42 alloy (iron alloy including 42% by weight of nickel).

(2) Chips were mounted on solder, and pressure of 80±5 g was applied so that the chips were adhered with pressure on die pads.

(3) Whether solder adhered to leads or not was determined by visual inspection (inspection by microscope) for the 1280 die pads of the frame C on which chips were mounted and 1280 die pads of frame D on chips were mounted.

The result of inspection was as shown in Table 2 below.

TABLE 2

Result of Example 2

|  | Ratio of adhesion of solder on leads |
| --- | --- |
| Conventional lead frame C | 5.46% |
| Lead frame D of FIG. 12 | 0% |

EXAMPLE 3

650 chips were mounted on die pads of a conventional lead frame E shown in FIG. 38 and on a lead frame F shown in FIG. 23, and an experiment to see if solder adheres to the leads was performed in accordance with the following procedure.

(1) The same amount of solder was placed on the die pads of E and F in an atmosphere at 400° C. The solder was lead-tin alloy including 95% by weight of lead. Lead frame was formed of 42 alloy (iron alloy including 42% by weight of nickel).

(2) Chips were mounted on solder, and pressure of 80±5 g was applied so that the chips were adhered with pressure on die pads.

(3) Whether solder adhered to leads or not was determined by visual inspection (inspection by microscope) for the 650 die pads of the frame E on which chips were mounted and 650 die pads of frame F on chips were mounted.

The result of inspection was as shown in Table 3 below.

TABLE 3

Result of Example 3

| | Ratio of adhesion of solder on leads |
|---|---|
| Conventional lead frame E | 21.3% |
| Lead frame F of FIG. 23 | 0% |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor element having a main surface;
   a die pad having a main surface on which said semiconductor element is mounted with an adhesive layer interposed, and a region surrounded by a first side, a second side opposing to the first side, a third side different from said first and second sides, and a fourth side opposing to the third side;
   a lead terminal formed of a conductor, electrically connected to said semiconductor element; and
   a resin covering part of said lead terminal, said semiconductor element and said die pad; wherein
   said die pad has a notch extending along said first and second sides and positioned opposing to the main surface of said semiconductor element, and
   a through hole extending along said third and fourth sides and positioned opposing to the main surface of the semiconductor element.

2. The semiconductor device according to claim 1, wherein
   one end of a plurality of said lead terminals oppose to said first and second sides.

3. The semiconductor device according to claim 2, wherein
   said notch is provided opposing to one end of said lead terminal.

4. A semiconductor device, comprising:
   a semiconductor element having a main surface;
   a die pad having a peripheral area, a main surface on which said semiconductor element is mounted with an adhesive layer interposed, and a region surrounded by a first side, a second side opposing to the first side, a third side different from said first and second sides, and a fourth side opposing to the third side;
   a lead terminal formed of a conductor, electrically connected to said semiconductor element; and
   a resin covering part of said lead terminal, said semiconductor element and said die pad; wherein
   said die pad has a first through hole extending along said first and second sides and positioned opposing to the main surface of said semiconductor element, and
   a second through hole extending along said third and fourth sides and positioned opposing to the main surface of semiconductor element, wherein
   the holes are provided only along the entire peripheral area of the die pad.

5. The semiconductor device according to claim 4, wherein
   one end of a plurality of said lead terminals oppose to said first and second sides.

6. The semiconductor device according to claim 4, wherein
   said first and second through holes are positioned in plural in a peripheral portion of said die pad.

7. The semiconductor device according to claim 5, wherein
   said first through hole is positioned opposing to one end of said lead terminal.

8. A semiconductor device, comprising:
   a semiconductor element having a main surface;
   a die pad having a peripheral area, a main surface on which said semiconductor element is mounted with an adhesive layer interposed, and a region surrounded by a first side, a second side opposing to the first side, a third side different from said first and second sides, and a fourth side opposing to the third side;
   a lead terminal formed of a conductor, electrically connected to said semiconductor element; and
   a resin covering part of said lead terminal, said semiconductor element and said die pad; wherein
   said die pad has a plurality of recesses arranged staggered along said first and second sides and positioned opposing to the main surface of said semiconductor element, and
   a through hole extending along said third and fourth sides and positioned opposing to the main surface of semiconductor element, wherein
   the recesses are provided only along the entire first and second sides of the die pad.

9. The semiconductor device according to claim 8, wherein
   one end of a plurality of said lead terminals oppose to said first and second sides.

10. The semiconductor device according to claim 8, wherein
    said through hole and said recesses are positioned in a peripheral portion of said die pad.

11. The semiconductor device according to claim 9, wherein
    said recesses are positioned opposing to one end of said lead terminal.

12. A lead frame, comprising:
    a die pad having a main surface on which a semiconductor element is mounted with an adhesive layer interposed, and a region surrounded by a first side, a second side opposing to the first side, a third side different from said first and second sides and a fourth side opposing to said third side; and a lead formed of a conductor, electrically connected to said semiconductor element; wherein said die pad has a notch extending along said first and second sides and position opposing to the main surface of said semiconductor element, and a through hole extending along said third and fourth sides and positioned opposing to the main surface of said semiconductor element.

13. The lead frame according to claim 12, wherein a plurality of said leads extend toward said first and second sides.

14. The lead frame according to claim 13, wherein said notch is provided in a direction in which said leads extend.

15. A lead frame, comprising:

a die pad having a peripheral area, a main surface on which a semiconductor element is mounted with an adhesive layer interposed, and a region surrounded by a first side, a second side opposing to the first side, a third side different from said first and second sides and a fourth side opposing to said third side; and a lead formed of a conductor, electrically connected to said semiconductor element; wherein said die pad has a first through hole extending along said first and second sides and positioned opposing to the main surface of said semiconductor element, and a second through hole extending along said third and fourth sides and positioned opposing to the main surface of said semiconductor element, wherein the holes are provided only along the entire peripheral area of the die pad.

16. The lead frame according to claim 15, wherein a plurality of said leads extend toward said first and second sides.

17. The lead frame according to claim 15, wherein a plurality of said first and second through holes are positioned in a peripheral portion of said die pad.

18. The lead frame according to claim 16, wherein said through hole is positioned in a direction in which said leads extend.

19. A lead frame, comprising:

a die pad having a peripheral area, a main surface on which a semiconductor device is mounted with an adhesive layer interposed, and a region surrounded by a first side, a second side opposing to the first side, a third side different from said first and second sides and a fourth side opposing to said third side; and a lead formed of a conductor, electrically connected to said semiconductor element; wherein said die pad has a plurality of recesses arranged staggered extending along said first and second sides and positioned opposing to the main surface of said semiconductor element, and a through hole extending along said third and fourth sides and positioned opposing to the main surface of said semiconductor element, wherein the recesses are provided only along the entire first and second sides of the die pad.

20. The lead frame according to claim 19, wherein a plurality of said leads extend toward said first and second sides.

21. The lead frame according to claim 19, wherein said through holes and said recesses are positioned in a peripheral portion of said die pad.

22. The lead frame according to claim 20, wherein said recesses are positioned in a direction in which said leads extend.

23. A lead frame, comprising;

a die pad having a main surface on which a semiconductor element is mounted with an adhesive layer interposed, and a region surrounded by a first side, a second side opposing to the first side, a third side different from said first and second sides, and a fourth side opposing to the third side;

a lead formed of a conductor, electrically connected to said semiconductor element;

a frame coupling said die pad to said lead; and a connecting portion for connecting said frame to said die pad; wherein said die pad has a notch extending along said first and second sides and positioned opposing to a main surface of said semiconductor element, and a through hole extending along said third and fourth sides and positioned opposing to the main surface of said semiconductor element.

24. The lead frame according to claim 23, wherein said connecting portion is connected to said third and fourth sides of said die pad, respectively.

25. The lead frame according to claim 23, wherein a plurality of said leads extends toward said first and second sides.

26. The lead frame according to claim 24, wherein said through hole is positioned on both sides of a portion of said die pad which is connected to said connecting portion.

27. A lead frame, comprising;

a die pad having a peripheral area, a main surface on which a semiconductor element is mounted with an adhesive layer interposed, and a region surrounded by a first side, a second side opposing to the first side, a third side different from said first and second sides, and a fourth side opposing to the third side;

a lead formed of a conductor, electrically connected to said semiconductor element;

a frame coupling said die pad to said lead; and a connecting portion for connecting said frame to said die pad; wherein said die pad has a first through hole extending along said first and second sides and positioned opposing to a main surface of said semiconductor element, and a second through hole extending along said third and fourth sides and positioned opposing to the main surface of said semiconductor element, wherein the holes are provided only along the entire peripheral area of the die pad.

28. The lead frame according to claim 27, wherein said connecting portion is connected to said third and fourth sides of said die pad, respectively.

29. The lead frame according to claim 27, wherein a plurality of said leads extends toward said first and second sides.

30. The lead frame according to claim 28, wherein said second through hole is positioned on both sides of a portion of said die pad which is connected to said connecting portion.

31. A lead frame, comprising;

a die pad having a peripheral area, a main surface on which a semiconductor element is mounted with an adhesive layer interposed, and a region surrounded by a first side, a second side opposing to the first side, a third side different from said first and second sides, and a fourth side opposing to the third side;

a lead formed of a conductor, electrically connected to said semiconductor element;

a frame coupling said die pad to said lead; and a connecting portion for connecting said frame to said die pad; wherein said die pad has a plurality of recesses arranged staggered along said first and second sides and positioned opposing to a main surface of said semiconductor element, and a through hole extending along said third and fourth sides and positioned opposing to the main surface of said semiconductor element, wherein the recesses are provided only along the entire first and second sides of the die pad.

32. The lead frame according to claim 31, wherein said connecting portion is connected to said third and fourth sides of said die pad, respectively.

33. The lead frame according to claim 31, wherein a plurality of said leads extends toward said first and second sides.

34. The lead frame according to claim 32, wherein said through hole is positioned on both sides of a portion of said die pad which is connected to said connecting portion.

* * * * *